United States Patent
Kim

(10) Patent No.: US 11,295,793 B2
(45) Date of Patent: Apr. 5, 2022

(54) SYSTEM-LEVEL TIMING BUDGET IMPROVEMENTS

(71) Applicant: Micron Technology, Inc., Boise, ID (US)

(72) Inventor: Kang-Yong Kim, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 134 days.

(21) Appl. No.: 16/781,949

(22) Filed: Feb. 4, 2020

(65) Prior Publication Data

US 2020/0176038 A1 Jun. 4, 2020

Related U.S. Application Data

(63) Continuation of application No. 16/121,217, filed on Sep. 4, 2018, now Pat. No. 10,593,383.

(51) Int. Cl.
*G06F 12/00* (2006.01)
*G11C 7/22* (2006.01)
*G06F 1/12* (2006.01)
*G06F 13/16* (2006.01)

(52) U.S. Cl.
CPC .............. *G11C 7/222* (2013.01); *G06F 1/12* (2013.01); *G06F 13/1689* (2013.01); *G11C 7/22* (2013.01)

(58) Field of Classification Search
CPC .. G11C 7/222; G11C 7/22; G06F 1/12; G06F 13/1689
See application file for complete search history.

(56) References Cited

U.S. PATENT DOCUMENTS

| | | | |
|---|---|---|---|
| 6,333,562 B1 | 12/2001 | Lin | |
| 6,459,652 B1* | 10/2002 | Lee | G11C 7/22 365/233.14 |
| 6,762,974 B1 | 7/2004 | Johnson et al. | |
| 8,645,117 B2 | 2/2014 | Yin et al. | |
| 2003/0070052 A1 | 4/2003 | Lai | |
| 2009/0055678 A1 | 2/2009 | Kummaraguntla et al. | |
| 2009/0146283 A1 | 6/2009 | Chen et al. | |

(Continued)

FOREIGN PATENT DOCUMENTS

| | | |
|---|---|---|
| CN | 1756080 A | 4/2006 |
| CN | 103809659 A | 5/2014 |
| CN | 107430568 A | 12/2017 |

OTHER PUBLICATIONS

China National Intellectual Property Administration, "First Office Action," issued in connection with Chinese Patent Application No. 201910791227.5, dated Oct. 16, 2020 (4 pages).

*Primary Examiner* — Shawn X Gu
(74) *Attorney, Agent, or Firm* — Holland & Hart LLP

(57) ABSTRACT

Methods, systems, and devices for system-level timing budget improvements are described. Each memory die in a memory device may determine an offset between its system clock signal and its data clock signal. The offsets of each memory die in the memory device may be different; e.g., having different magnitudes and/or polarities. A memory die in the memory device may adjust its own data clock signal by a delay that is based on the offsets of two or more memory die in the device. The memory die may adjust its data clock signal by setting a fuse in a delay adjuster on the memory die. Adjusting the data clock signal may match an offset of a first memory die with an offset of a second memory die.

20 Claims, 11 Drawing Sheets

(56) References Cited

U.S. PATENT DOCUMENTS

| | | |
|---|---|---|
| 2010/0258905 A1 | 10/2010 | Song et al. |
| 2013/0277831 A1 | 10/2013 | Yoon et al. |
| 2014/0021608 A1 | 1/2014 | Choi |
| 2014/0141566 A1 | 5/2014 | Schuetz |
| 2015/0221614 A1 | 8/2015 | Sutardja |
| 2016/0307832 A1 | 10/2016 | Uzoh et al. |
| 2019/0103357 A1 | 4/2019 | Lim et al. |

\* cited by examiner

US 11,295,793 B2

SYSTEM-LEVEL TIMING BUDGET IMPROVEMENTS

CROSS REFERENCE

The present Application for Patent is a continuation of and claims priority to and the benefit of U.S. Pat. No. 10,593,383 by Kim, entitled "SYSTEM-LEVEL TIMIMNG BUDGET IMPROVEMENTS," filed Sep. 4, 2018, assigned to the assignee hereof, and is expressly incorporated by reference in its entirety herein.

BACKGROUND

The following relates generally to mitigating clock signal timing variation in multi-die memory devices, and more specifically to system-level timing budget improvements.

Memory devices are widely used to store information in various electronic devices such as computers, wireless communication devices, cameras, digital displays, and the like. Information is stored by programming different states of a memory device. For example, binary devices most often store one of two states, often denoted by a logic "1" or a logic "0." In other devices, more than two states may be stored. To access the stored information, a component of the device may read, or sense, at least one stored state in the memory device. To store information, a component of the device may write, or program, the state in the memory device.

Various types of memory devices exist, including magnetic hard disks, random access memory (RAM), read only memory (ROM), dynamic RAM (DRAM), synchronous dynamic RAM (SDRAM), ferroelectric RAM (FeRAM), magnetic RAM (MRAM), resistive RAM (RRAM), flash memory, phase change memory (PCM), and others. Memory devices may be volatile or non-volatile. Non-volatile memory, e.g., FeRAM, may maintain their stored logic state for extended periods of time even in the absence of an external power source. Volatile memory devices, e.g., DRAM, may lose their stored state over time unless they are periodically refreshed by an external power source. FeRAM may use similar device architectures as volatile memory but may have non-volatile properties due to the use of a ferroelectric capacitor as a storage device. FeRAM devices may thus have improved performance compared to other non-volatile and volatile memory devices.

Improving memory devices, generally, may include increasing memory cell density, increasing read/write speeds, increasing reliability, increasing data retention, reducing power consumption, or reducing manufacturing costs, among other metrics.

DETAILED DESCRIPTION

Figure 1:
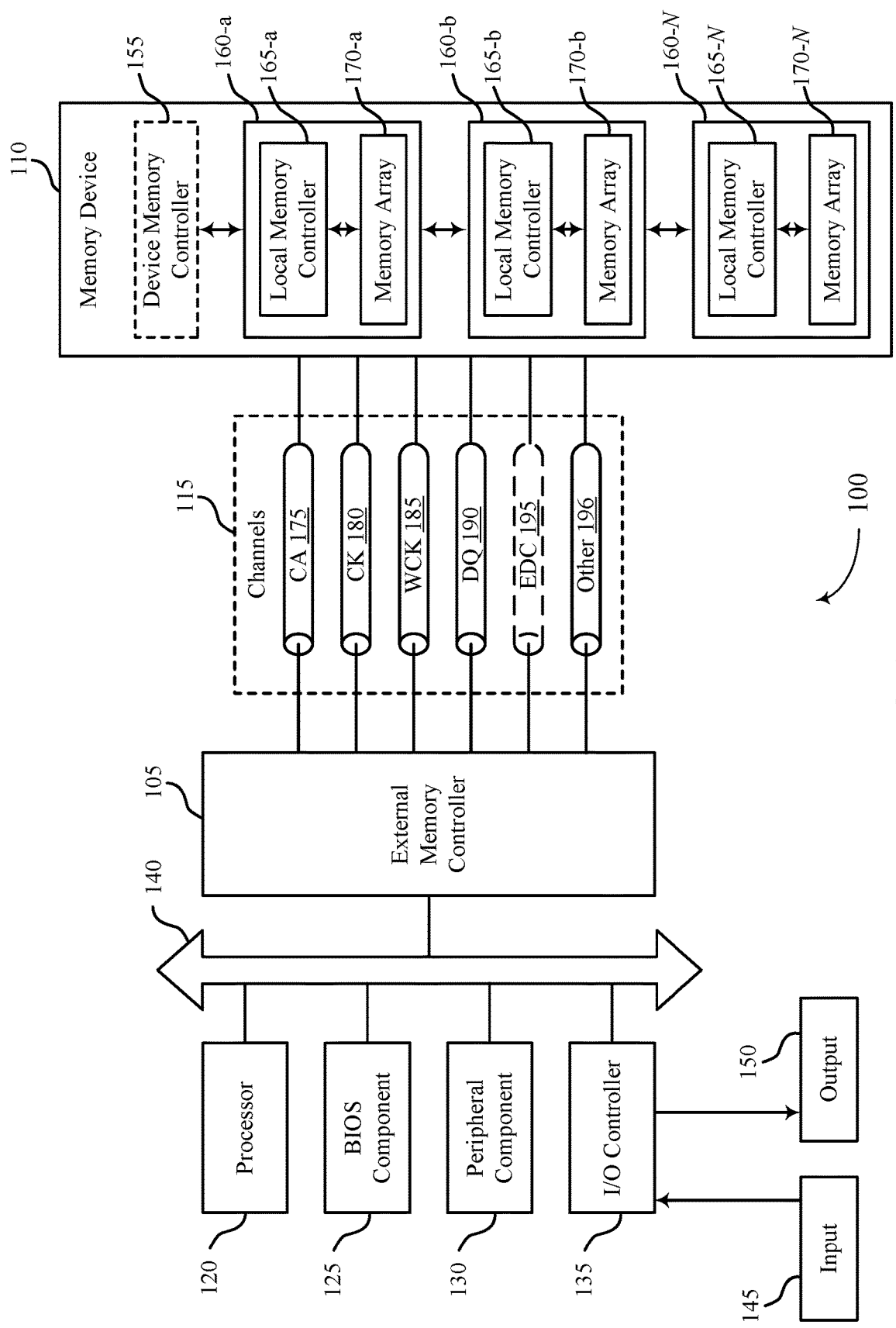
FIG. 1 illustrates an example of a system that supports system level timing budget improvements in accordance with aspects of the present disclosure.

A memory device may include multiple memory dice in a single package. Such memory die may receive clock signals from a memory controller, such as a system clock signal (which may be referred to as CK) and a data clock signal (which may be referred to as WCK). The memory controller may generate a source system clock signal and a source data clock signal that are subsequently split and shared among multiple memory dice. Thus, the source system clock signal may be a common system clock signal (e.g., common to multiple memory dice), and the source data clocks signal may be a common data clock signal (e.g., common to multiple memory dice). Such clock signals may be used by the memory die to synchronize or otherwise support timing aspects of memory access operations (e.g., read or write operations).

In some cases, the clock signals received by each memory die may be phase-shifted (e.g., offset or delayed) from the clock signals generated by the memory controller, due to delays associated with the conductive signal paths (e.g., channel delays) between the controller and the memory die or other factors. In some cases, differences in channel delays may cause a memory die to receive a system clock signal that is offset from the data clock signal. Such an offset (which may be referred to as a WCK/CK offset) may be undesirable because it may reduce the timing budget associated with memory operations for the memory die or for the whole memory device.

Further, the signal paths for different dice may differ from one another, and each memory die may introduce additional offsets after the clock signals are received by the memory die, due to internal differences in process variations, etc. As a result, each memory die may have a different WCK/CK offset, possibly including a different polarity (e.g., the offset may cause the data clock signal to variously lead or lag the system clock signal, depending on the polarity of the offset between the two signals).

Traditional methods for mitigating such a WCK/CK offset (e.g., write-leveling) may include adjusting the source data clock generated by the memory controller to reduce an offset at a memory die. However, for memory devices that include multiple memory dice having different offsets with potentially different polarities, such a method may be ineffective. Thus, in accordance with aspects of the current disclosure, die-specific offset adjustments may be made. In some cases, die-specific offset adjustments may be made in a coordinated fashion, and may be in addition to global offset adjustments. For example, each memory die may beneficially include an internal delay adjuster to compensate for the different offsets introduced into the clock signals of an individual memory die within a set of memory dies.

Features of the disclosure introduced above are further described below in the context of systems and devices, such as the example system and devices depicted in FIG. 1. Additional examples are then described with reference to FIGS. 2-8. These and other features of the disclosure are further illustrated by and described with reference to flowcharts in FIGS. 9-11 that relate to system-level timing budget improvements.

FIG. 1 illustrates an example of a system 100 that utilizes one or more memory devices in accordance with various embodiments of the present disclosure. The system 100 may include an external memory controller 105, a memory device 110, and plurality of channels 115 coupling the external memory controller 105 with the memory device 110. The system 100 may include one or more memory devices, but for ease of description the one or more memory devices may be described as a single memory device 110.

The system 100 may include aspects of an electronic device, such as a computing device, a mobile computing device, a wireless device, or a graphics processing device. The system 100 may be an example of a portable electronic device. The system 100 may be an example of a computer, a laptop computer, a tablet computer, a smartphone, a cellular phone, a wearable device, an internet-connected device, or the like. In some examples, the system 100 is configured for bi-directional wireless communication with other systems or devices using a base station or access point. In some examples, the system 100 is capable of machine-type communication (MTC), machine-to-machine (M2M) communication, or device-to-device (D2D) communication.

At least portions of the system 100 may be examples of a host device. Such a host device may be an example of a device that uses memory to execute processes such as a computing device, a mobile computing device, a wireless device, a graphics processing device, a computer, a laptop computer, a tablet computer, a smartphone, a cellular phone, a wearable device, an internet-connected device, some other stationary or portable electronic device, or the like. In some cases, the external memory controller 105 may be referred to as a host.

In some cases, a memory device 110 may be an independent device that is configured to be in communication with other components of the system 100 and provide physical memory addresses/space to potentially be used or referenced by the system 100. In some examples, a memory device 110 may be able to work with at least one or a plurality of different types of systems 100. Signaling between the components of the system 100 and the memory device 110 may be operable to support different modulation schemes to modulate the signals, different pin designs for communicating the signals, distinct packaging of the system 100 and the memory device 110, clock signaling and synchronization between the system 100 and the memory device 110, timing conventions, and/or other factors.

The memory device 110 may be configured to store data for the components of the system 100. In some cases, the memory device 110 may act as a slave-type device to the system 100 (e.g., responding to and executing commands provided by the system 100 through the external memory controller 105). Such commands may include an access command for an access operation, such as a write command for a write operation, a read command for a read operation, a refresh command for a refresh operation, or other commands. The memory device 110 may include two or more memory die 160 (e.g., memory chips) to support a desired or specified capacity for data storage. The memory device 110 including two or more memory die may be referred to as a multi-die memory or package (also referred to as multi-chip memory or package).

The system 100 may further include a processor 120, a basic input/output system (BIOS) component 125, one or more peripheral components 130, and an input/output (I/O) controller 135. The components of system 100 may be in electronic communication with one another using a bus 140.

The processor 120 may be configured to control at least portions of the system 100. The processor 120 may be a general-purpose processor, a digital signal processor (DSP), an application-specific integrated circuit (ASIC), a field-programmable gate array (FPGA) or other programmable logic device, discrete gate or transistor logic, discrete hardware components, or it may be a combination of these types of components. In such cases, the processor 120 may be an example of a central processing unit (CPU), a graphics processing unit (GPU), or a system on a chip (SoC), among other examples.

The BIOS component 125 may be a software component that includes a BIOS operated as firmware, which may initialize and run various hardware components of the system 100. The BIOS component 125 may also manage data flow between processor 120 and the various components of the system 100, e.g., peripheral components 130, input/output controller 135, etc. The BIOS component 125 may include a program or software stored in read-only memory (ROM), flash memory, or any other non-volatile memory.

Peripheral component(s) 130 may be any input or output device, or an interface for such devices, that may be integrated into or with the system 100. Examples may include disk controllers, sound controller, graphics controller, Ethernet controller, modem, universal serial bus (USB) controller, a serial or parallel port, or peripheral card slots, such as peripheral component interconnect (PCI) or accelerated graphics port (AGP) slots. Peripheral component(s) 130 may be other components understood by those skilled in the art as peripherals.

The I/O controller 135 may manage data communication between the process or 120 and peripheral component(s) 140, input devices 145, or output devices 150. The I/O controller 135 may also manage peripherals that are not integrated into or with the system 100. In some cases, the I/O controller 135 may represent a physical connection or port to the external peripheral.

The input 145 may represent a device or signal external to the system 100 that provides information, signals, or data to the system 100 or its components. This may include a user interface or interface with or between other devices. In some cases, the input 145 may be a peripheral that interfaces with system 100 via one or more peripheral components 130 or may be managed by the I/O controller 135.

The output 150 may represent a device or signal external to the system 100 configured to receive an output from the system 100 or any of its components. Examples of the output 150 may include a display, audio speakers, a printing device, or another processor on printed circuit board, etc. In some cases, the output 150 may be a peripheral that interfaces with the system 100 via one or more peripheral components 130 or may be managed by I/O controller 135.

The components of system 100 may be made up of general- or special-purpose circuitry designed to carry out their functions. This may include various circuit elements, for example, conductive lines, transistors, capacitors, inductors, resistors, amplifiers, or other active or passive elements, configured to carry out the functions described herein.

The memory device 110 may include a device memory controller 155 and one or more memory dice 160. A memory die 160 may include a local memory controller 165 and a memory array 170. A memory array 170 may be an example of collection (e.g., grid) of memory cells, with each memory cell being configured to store at least one bit of digit data.

The device memory controller 155 may include circuits or components configured to control operations of the memory device 110. As such, the device memory controller 155 may include the hardware, firmware, and software that enables the memory device 110 to perform commands and may be configured to receive, transmit, or execute commands, data, or control information related to the memory device 110. The device memory controller 155 may be configured to communicate with the external memory controller 105, the one or more memory die 160, or the processor 120. In some cases, the memory device 110 may receive data and/or commands from the external memory controller 105. For example, the memory device 110 may receive a write command indicating that the memory device 110 is to store certain data on behalf of a component of the system 100 (e.g., the processor 120) or a read command indicating that the memory device 110 is to provide certain data stored in a memory die (e.g., a memory array 170) to a component of the system 100 (e.g., the processor 120). In some cases, the device memory controller 155 may control operation of the memory device 110 described herein in conjunction with the local memory controller 165 of the memory die 160. Examples of the components included in the memory controller 150 may include receivers for demodulating signals received from the external memory controller 105, decoders for modulating and transmitting signals to the external memory controller 105, decoders, amplifiers, filters, or the like.

The local memory controller 165 (e.g., local to a memory die 160) may be configured to control operations of the memory die 160. Also, the local memory controller 165 may be configured to communicate (e.g., receive and transmit data and/or commands) with the device memory controller 155. The local memory controller 165 may support the device memory controller 155 to control operation of the memory device 110 described herein. In some cases, the memory device 110 does not include the device memory controller 155, and the local memory controller 165 or the external memory controller 105 may perform the various functions ascribed herein to the device memory controller 155. As such, the local memory controller 165 may be configured to communicate with the device memory controller 155, with other local memory controllers 165, or directly with the external memory controller 105 or the processor 120.

External memory controller 105 may be configured to enable communication of information, data, and/or commands between components of the system 100 (e.g., the processor 120) and the memory device 110. The external memory controller 105 may act as a liaison between the components of the system 100 and the memory device 110 so that the components of the system 100 may not need to know the details of the memory device's operation. The components of the system 100 may present requests to the external memory controller 105 (e.g., read commands or write commands) that the external memory controller 105 satisfies. The external memory controller 105 may convert or translate communications exchanged between the components of the system 100 and the memory device 110. In some cases, the external memory controller 105 may include a system clock that generates a common (source) system clock signal. In some cases, the external memory controller 105 may include a common data clock that generates a common (source) data clock signal.

In some cases, the external memory controller 105 or other component of the system 100, or its functions described herein, may be implemented by the processor 120. For example, the external memory controller 105 may be hardware, firmware, or software, or some combination thereof implemented by the processor 120 or other component of the system 100. While external memory controller 105 is depicted as being external to memory device 110, in some cases, external memory controller 105, or its functions as described herein, may be implemented by a memory device 110. For example, the external memory controller 105 may be hardware, firmware, or software, or some combination thereof implemented by the device memory controller 155 or one or more local memory controllers 165. In some cases, the external memory controller 105 may be distributed across the processor 120 and the memory device 110 such that portions of the external memory controller 105 are implemented by the processor 120 and other portions are implemented by a device memory controller 155 or a local memory controller 165. Likewise, in some cases, one or more functions ascribed herein to the device memory controller 155 or local memory controller 165 may in some cases be performed by the external memory controller 105 (either separate from or as included in the processor 120).

The components of the system 100 may exchange information with the memory device 110 using a plurality of channels 115. In this example, the channels enable communications between the external memory controller 105 and the memory device 110. Each channel 115 may include one or more signal paths or transmission mediums (e.g., conductors) between terminals associated with the components of system 100. For example, a channel 115 may include a first terminal comprising one or more pins or pads at the external memory controller 105 and one or more pins or pads at the memory device 110. A pin may be an example of a conductive input or output point of a device of the system 100, and a pin may be configured to act as part of a channel. In some cases, a pin or pad of a terminal may be part of a signal path of the channel 115. Additional signal paths may be coupled with a terminal of a channel for routing signals within a component of the system 100. For example, the memory device 110 may include signal paths (e.g., signal paths internal to the memory device 110 or its components, such as internal to a memory die 160) that route a signal from a terminal of a channel 115 to the various components of the memory device 110 (e.g., a device memory controller 155, memory die 160, local memory controllers 165, memory arrays 170).

Channels 115 (and associated signal paths and terminals) may be dedicated to communicating specific types of information. In some cases, a channel 115 may be an aggregated channel 115 and thus may include multiple individual channels.

In some cases, the channels 115 may include one or more command and address (CA) channels 175. The CA channels 175 may be configured to communicate commands between the external memory controller 105 and the memory device 110 including control information associated with the commands (e.g., address information). For example, the CA channel 175 may include a read command with an address of the desired stored data. In some cases, the CA channels 175 may be registered on a rising clock signal edge and/or a falling clock signal edge. In some cases, a CA channel 175 may include eight or nine signal paths.

In some cases, the channels 115 may include one or more clock signal (CK) channels 180. The CK channels 180 may be configured to communicate a common clock signal between the external memory controller 105 and the memory device 110. The clock signal may be configured oscillate between a high state and a low state and coordinate the actions of the external memory controller 105 and the memory device 110. In some cases, the clock signal may be a differential output (e.g., a CK_t signal and a CK_c signal) and the signal paths of the CK channels 180 may be configured accordingly. In some cases, the clock signal may be single ended. In some cases, the clock signal may be a 1.5 GHz signal. A CK channel 180 may include any number of signal paths. In some cases, the clock signal (e.g., a CK_t signal and a CK_c signal) may provide a timing reference for command and addressing operations for the memory device 110, or other system-wide operations for the memory device 110. The clock signal CK may therefore be variously referred to as a control clock signal CK, a command clock signal CK, or a system clock signal CK. The system clock signal CK may be generated by a system clock, which may include one or more hardware components (e.g., oscillators, crystals, logic gates, transistors, or the like).

In some cases, the channels 115 may include one or more write clock signal (WCK) channels 185. While the 'W' in WCK may nominally stand for "write," a write clock signal WCK (e.g., a WCK_t signal and a WCK_c signal) may provide a timing reference for access operations generally for the memory device 110 (e.g., a timing reference for both read and write operations). Accordingly, the write clock signal WCK may also be referred to as a data clock signal WCK. The WCK channels 185 may be configured to communicate a common data clock signal between the external memory controller 105 and the memory device 110. The data clock signal may be configured coordinate an access operation (e.g., a write operation, a read operation) of the external memory controller 105 and the memory device 110. In some cases, the write clock signal may be a differential output (e.g., a WCK_t signal and a WCK_c signal) and the signal paths of the WCK channels 185 may be configured accordingly. A WCK channel 185 may include any number of signal paths. The data clock signal WCK may be generated by a data clock, which may include one or more hardware components (e.g., oscillators, crystals, logic gates, transistors, or the like).

In some cases, the channels 115 may include one or more data (DQ) channels 190. The data channels 190 may be configured to communicate data and/or control information between the external memory controller 105 and the memory device 110. For example, the data channels 190 may communicate information (e.g., bi-directional) to be written to the memory device 110 or information read from the memory device 110. The data channels 190 may communicate signals that may be modulated to include symbols using a variety of different modulation schemes (e.g., NRZ, PAM4). In some cases, a data channel 190 may be x4 (e.g., including four signal paths), x8 (e.g., including eight signal paths), x16 (including sixteen signal paths), etc.

In some cases, the channels 115 may, optionally, include one or more error detection code (EDC) channels 195. The error detection code channels 195 may be configured to communicate error detection signals, such as checksums, to improve system reliability. An EDC channel 195 may include any number of signal paths.

In some cases, the channels 115 may include one or more other channels 196 that may be dedicated to other purposes. These other channels 196 may include any number of signal paths.

In some cases, external memory controller 105 may be configured to generate a source data clock signal WCK and a source system clock signal CK. In some cases, the source data clock signal and/or source system clock signal may be routed (e.g., on WCK channel 185 and CK channel 180) from the external memory controller 105 to one or more memory die (e.g., memory die included in memory device 110). In some cases, external memory controller 105 may be configured to receive, from a first memory die (e.g., memory die 160), an indication of an offset between an adjusted data clock signal and a system clock signal. In some cases, external memory controller 105 may be configured to adjust the source data clock signal to compensate for the offset. In some cases, external memory controller 105 may be configured to receive an indication of a first offset between a first data clock signal and a first system clock signal from a first memory die, receive an indication of a second offset between a second data clock signal and a second system clock signal from a second memory die, and determine a delay based on the first offset, the second offset, or a combination thereof. In some cases, external memory controller 105 may be configured to configure a delay adjuster to adjust the first data clock signal by the delay.

Figure 2:
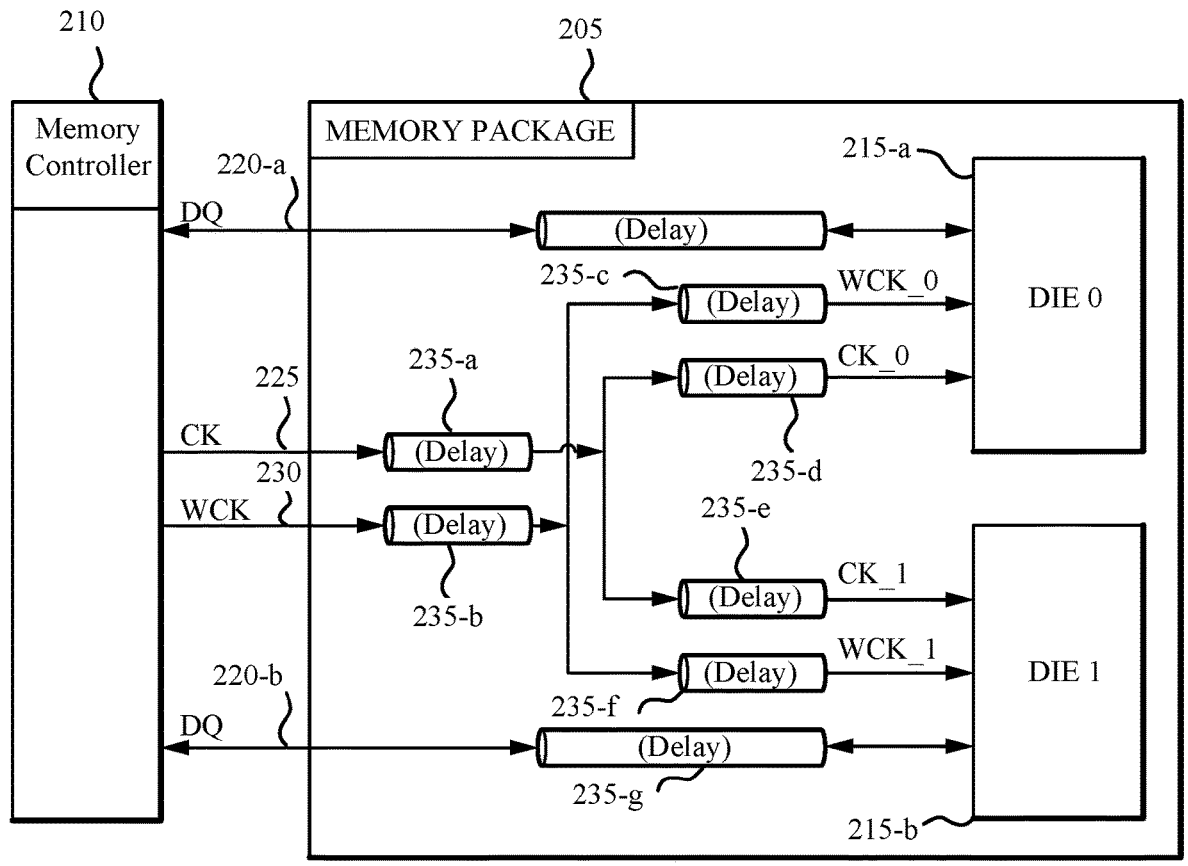
FIG. 2 shows a block diagram of a device that supports system level timing budget improvements in accordance with aspects of the present disclosure.

FIG. 2 depicts an example of a memory system 200 that supports system-level timing budget improvements. Memory system 200 includes a memory 205 and memory controller 210. Memory 205 includes multiple memory dice 215-*a*, 215-*b*, each of which may be an example of memory die 160. In some examples, multiple memory dice 215-*a*, 215-*b* may be included within a single memory package. Memory controller 210 may be an example of external memory controller 105, device memory controller 155, and/or local memory control 165. In some cases, features or operations of memory controller 210 may be performed by or distributed among external memory controller 105, device memory controller 155, and/or local memory control 165.

Memory controller 210 may be configured to generate a source data clock signal WCK that may be transmitted to the memory 205 on a source data clock signal channel 230. Memory controller 210 may be configured to generate a source system clock signal CK that may be transmitted to the memory 205 on a source system clock signal channel 225. Memory controller 210 may be coupled with one or more data (DQ) channels 220 for reading or writing data or control information from or to a respective memory die 215.

The source data clock signal WCK and source system clock signal CK may be used to generate a first data clock signal WCK_0 and first system clock signal CK_0, respectively, for the first memory die 215-*a*. The source data clock signal WCK and source system clock signal CK may also be used to generate a second data clock signal WCK_1 and second system clock signal CK_1 for the second memory die 215-*b*. For example, the source system clock signal CK may be split within a memory package of memory 205 (e.g., by a device memory controller 155 or another component within the memory 205), and a resulting first system clock signal CK_0 may be coupled with the first memory die 215-a while a resulting second system clock signal CK_1 may be coupled with the second memory die 215-b, as depicted in FIG. 2. Similarly, the source data clock signal WCK may be split within the memory 205 (e.g., by a device memory controller 155 or another component within the memory 205), and a resulting first data clock signal WCK_0 may be coupled with the first memory die 215-a while a resulting second data clock signal WCK_1 may be coupled with the second memory die 215-b, as depicted in FIG. 2.

Ideally, the data clock signal WCK_0, WCK_1 and system clock signal CK_0, CK_1 received by each memory die 215-a, 215-b in memory 205 have the same phase as the respective source data clock signal WCK and source system clock signal CK. However, in practice, the first and second data clock signals WCK_0, WCK_1 received by the first and second memory die 215 (respectively) may be offset (e.g., phase-shifted) from the source data clock signal WCK by a phase offset, and the first and second system clock signals CK_0, CK_1 received by the first and second memory die may be offset from the source system clock signal CK by a phase offset. Such phase offsets may be introduced by, for example, signal delays caused by long wires, capacitive coupling, or other sources. Such signal delays, and thus a source of such offsets, may be visually represented in FIG. 2 as delays 235, and it should be understood that, in practice, the length of an individual delay 235 may vary (e.g., may be shorter or longer) relative the corresponding depiction in FIG. 2. For example, two delays 235 depicted in FIG. 2 as having a same length may in practice have a different length, and two delays 235 depicted in FIG. 2 as having a different length may in practice have a same length. A phase offset may be referred to simply as an offset.

As a result of delays 235, WCK_0 and WCK_1 may each be phase-shifted (e.g., offset) relative to WCK, and CK_0 and CK_1 may each be phase-shifted relative to CK. In some cases, WCK_0 and WCK_1 may each be phase-shifted relative to WCK by the same offset or by a different offset. Similarly, CK_0 and CK_1 may each be phase-shifted from CK by the same offset or by a different offset.

In some cases, WCK_0 may be phase-shifted from CK_0 by a first offset, and WCK_1 may be phase-shifted from CK_1 by a second offset. In some cases, an offset between a data clock signal (WCK, WCK_0, WCK_1) and a corresponding system clock signal (e.g., CK, CK_0, CK_1) signal may be referred to as a WCK/CK offset. Such WCK/CK offsets may be undesirable as they may adversely affect the performance of a memory die during memory access operations.

In some cases, an offset may have a magnitude (e.g., an amount of time) and a polarity (e.g., a direction or sign), where the polarity may be a positive polarity or a negative polarity. For example, a positive WCK/CK offset between a first signal (e.g., WCK) and a second signal (e.g., CK) may mean that the second signal is leading, or "ahead of" the first signal by the amount of time; e.g., a rising edge of the second signal occurs before a rising edge of the first signal. Conversely, a negative WCK/CK offset may mean that the second signal is lagging or "behind" the first signal by the amount of time; e.g., that a rising edge of the second signal occurs after the rising edge of the first signal. In some cases, the definition of the polarities described above may be reversed without loss of meaning; that is, the positive polarity may be described as a negative polarity, while the opposite (negative) polarity may be described as a positive polarity.

In some cases, such offsets may reduce the timing budget associated with performing read or write operations on memory die 215. Thus, it may be desirable to compensate for such offsets to maintain system synchronization such that each memory die has accurately synchronized timing signals with which to perform read and write operations.

Figure 3:
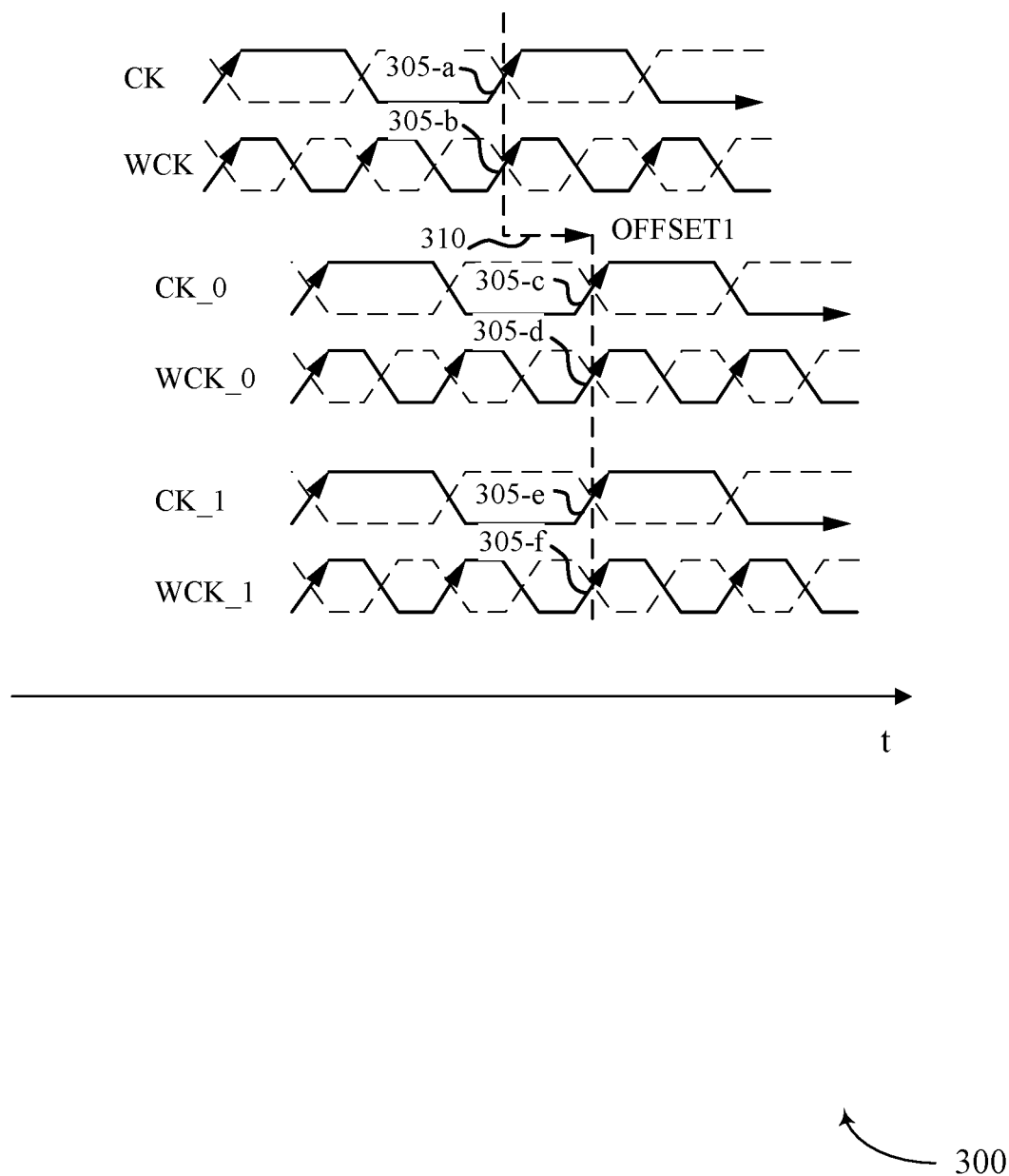
FIG. 3 shows a timing diagram for a system that supports system level timing budget improvements in accordance with aspects of the present disclosure.

FIG. 3 illustrates a signal timing diagram 300 that may depict a timing relationship between the various clocks depicted in the memory system 200 of FIG. 2, including a source data clock signal WCK, first and second data clock signals WCK_0, WCK_1, source system clock signal CK, and first and second system clock signals CK_0, CK_1.

In this example, the source data clock signal WCK and source system clock signal CK are phase-aligned; that is, the rising edge 305-a of the source data clock signal WCK is phase-aligned with the rising edge 305-b of the source system clock signal CK such that they occur at substantially the same time, with zero offset.

In this example, due to delays 235 in memory system 200, the first data clock signal WCK_0, second data clock signal WCK_1, first system clock signal CK_0, and second system clock signal CK_1 are all offset from the source data clock signal WCK and source system clock signal CK by the same offset 310. That is, each of these clock signals is offset by the same amount of time and with the same polarity (e.g., direction) relative to the source data clock signal WCK and source system clock signal CK.

In this example, because each of WCK_0, CK_0, WCK_1, and CK_1 are all offset from WCK and CK by the same offset OFFSET1 310, the first data clock signal WCK_0 and first system clock signal CK_0 have zero offset relative to each other, as do the second data clock signal WCK_1 and second system clock signal CK_1. That is, the rising edge 305-c of the first data clock signal WCK_0 is phase-aligned with the rising edge 305-d of the first system clock signal CK_0 such that they occur at substantially the same time, and the rising edge 305-e of the second data clock signal WCK_1 is phase-aligned with the rising edge 305-d of the second system clock signal CK_1 such that they occur at substantially the same time. Although the clock signals received by each memory die are offset from the source clock signals, they are phase-aligned with each other. Such phase alignment may be desirable and may provide each memory die with accurate clock signal timing with which to perform access operations (e.g., read and write operations).

Figure 4A:
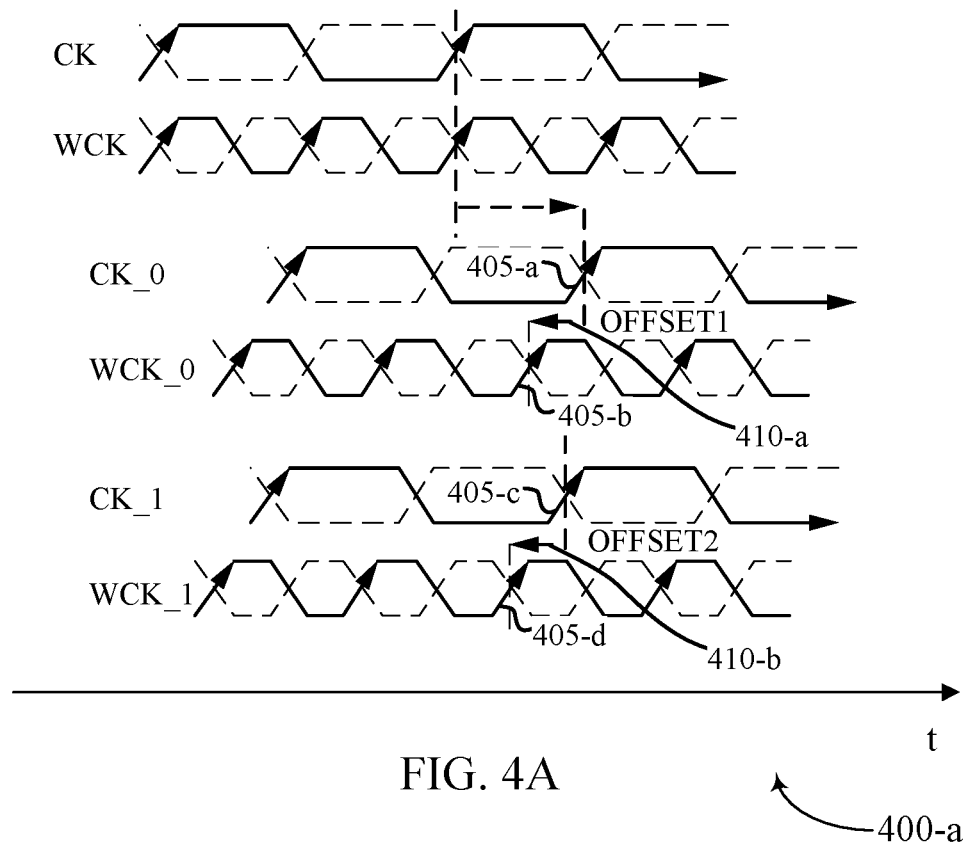
FIG. 4A shows a timing diagram for a system that supports system level timing budget improvements in accordance with aspects of the present disclosure.

FIG. 4A illustrates a signal timing diagram 400-a that may depict a timing relationship between the various clocks depicted in the memory system 200 of FIG. 2, including a source data clock signal WCK, first and second data clock signals WCK_0, WCK_1, source system clock signal CK, and first and second system clock signals CK_0, CK_1.

In this example, the first data clock signal WCK_0 and first system clock signal CK_0 are each offset from the source data clock signal WCK and source system clock signal CK by different amounts of time (e.g., different offset magnitudes), leading to a first WCK/CK offset OFFSET1 410-a between the first system clock signal CK_0 and the first data clock signal WCK_0. Similarly, the second data clock signal WCK_1 and second system clock signal CK_1 are each offset from the source data clock signal WCK and source system clock signal CK by different amounts of time, leading to a second WCK/CK offset OFFSET2 410-b between the second system clock signal CK_1 and the second data clock signal WCK_1.

In this example, the first offset 410-*a* and the second offset 410-*b* may be the same offset—e.g., they may have the same magnitudes (e.g., amounts of time) and the same polarity (e.g., direction or sign).

In this example, the first WCK/CK offset 410-*a* and the second WCK/CK offset 410-*b* may both be negative offsets. That is, the first data clock signal WCK_0 may have a negative offset relative to the first system clock signal CK_0 such that the rising edge 405-*a* of the first system clock signal CK_0 may occur after (e.g., later in time than) the relevant rising edge 405-*b* of the first data clock signal WCK_0. Similarly, the second data clock signal WCK_1 may have a negative offset relative to the second system clock signal CK_1 such that the rising edge 405-*c* of the second system clock signal CK_1 may occur after the relevant rising edge 405-*d* of the first data clock signal WCK_1. Thus, the polarity of both the first offset 410-*a* and second offset 410-*b* is negative.

In this example, the rising edge 405-*b* of the first data clock signal WCK_0 is not phase-aligned with the rising edge 405-*a* of the first system clock signal CK_0, and the rising edge 405-*d* of the second data clock signal WCK_0 is not phase-aligned with the rising edge 405-*c* of the second system clock signal CK_0. Such misalignment, or skew, due to the phase offset between the signals may reduce the timing budget associated with read/write operations for the memory die 215. Thus, in some cases, a memory controller (e.g., external memory controller 105) may attempt to compensate for the phase offsets 410-*a*, 410-*b* by adjusting (e.g., delaying or advancing) the source data clock signal WCK.

In some cases, the first memory die 215-*a* and/or the second memory die 215-*b* may provide one or more feedback signals including an indication of the first offset 410-*a* and/or the second offset 410-*b* to the external memory controller 105. As discussed below with respect to FIG. 4B, the external memory controller 105 may adjust the source data clock signal WCK to compensate for the offsets and reduce or substantially eliminate the first offset 410-*a* and the second offset 410-*b*. This adjustment may be referred to as "write leveling."

Figure 4B:
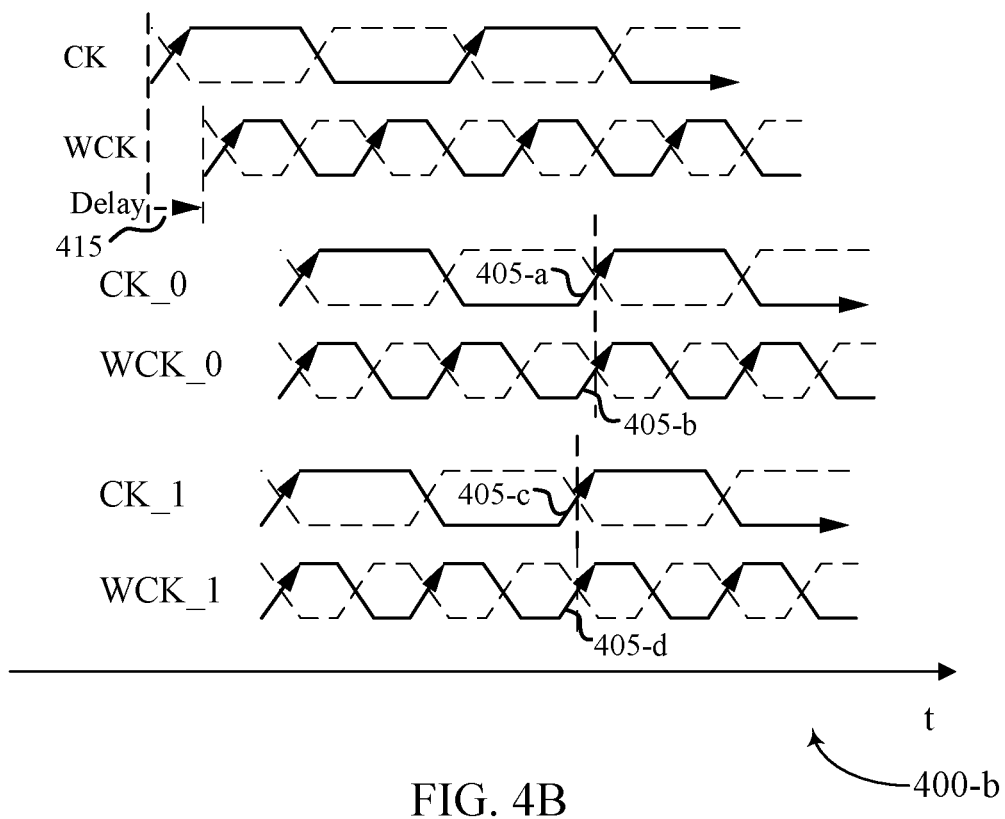
FIG. 4B shows a timing diagram for a system that supports system level timing budget improvements in accordance with aspects of the present disclosure.

FIG. 4B illustrates a signal timing diagram 400-*b* that may depict the timing relationships of the signals in FIG. 4A after a write-leveling procedure has been performed by, e.g., external memory controller 105.

In some cases, an external memory controller 105 may receive, from the first memory die and second memory die, an indication of the first offset 410-*a* and/or the second offset 410-*b*. As depicted in FIG. 5B, the external memory controller may, based on the indication of the first offset 410-*a* and/or the second offset 410-*b*, adjust the source data clock signal WCK to compensate for the first offset 410-*a* and/or the second offset 410-*b*. In this example, the external memory controller has adjusted WCK by delaying WCK by a delay 415. Delay 415 may be equal to the first offset 410-*a* or the second offset 410-*b*, for example, and may have the same magnitude as the first offset or the second offset but an opposite polarity (as shown). Because WCK_0 and WCK_1 are both based on WCK, adjusting WCK also adjusts WCK_0 and WCK_1, thereby phase-aligning the rising edge 405-*a* of WCK_0 with the rising edge 405-*b* of CK_0, and phase-aligning the rising edge 405-*c* of WCK_1 with the rising edge 405-*d* of CK_1. In this manner, an external memory controller 105 may compensate for the first offset 410-*a* and/or the second offset 410-*b* by adjusting the source data clock signal WCK.

In the case when the first offset 410-*a* and the second offset 410-*b* are the same offset (e.g., having the same magnitude and polarity), as depicted in FIG. 4, a single such adjustment to the source data clock signal WCK (e.g., an adjustment to the source data clock signal by a first delay 415 that is based on the first offset or second offset) may result in both the first data clock signal WCK_0 being phase-aligned with the first system clock signal CK_0, and the second data clock signal WCK_1 being phase-aligned with the second system clock signal CK_1, as depicted in signal timing diagram 400-*b*. As illustrated in FIGS. 4A and 4B, the first offset 410-*a* and the second offset 410-*b* may have the same magnitude and polarity, even if the two rising edges 405-*a*, 405-*c* of CK_0 and CK_1 have different delays relative to the source system clock signal CK. Thus, as illustrated in FIG. 4B, even though the rising edges 405-*b*, 405-*d* of WCK_0 and WCK_1 may not be completely phase-aligned with each other, write leveling may cause each data clock signal WCK_0, WCK_1 to be phase-aligned with the corresponding system clock signal CK_0, CK_1, so long as the first offset 410-*a* and the second offset 410-*b* are the same offset.

In other cases, the first offset 410-*a* may be different than the second offset 410-*b*. That is, the first offset may have a different magnitude and/or polarity than the second offset. If the first offset and the second offset have opposite polarities, the write-leveling procedure described with reference to FIGS. 4A and 4B (e.g., based exclusively on adjustment of the source data clock signal WCK) may be ineffective.

Figure 5:
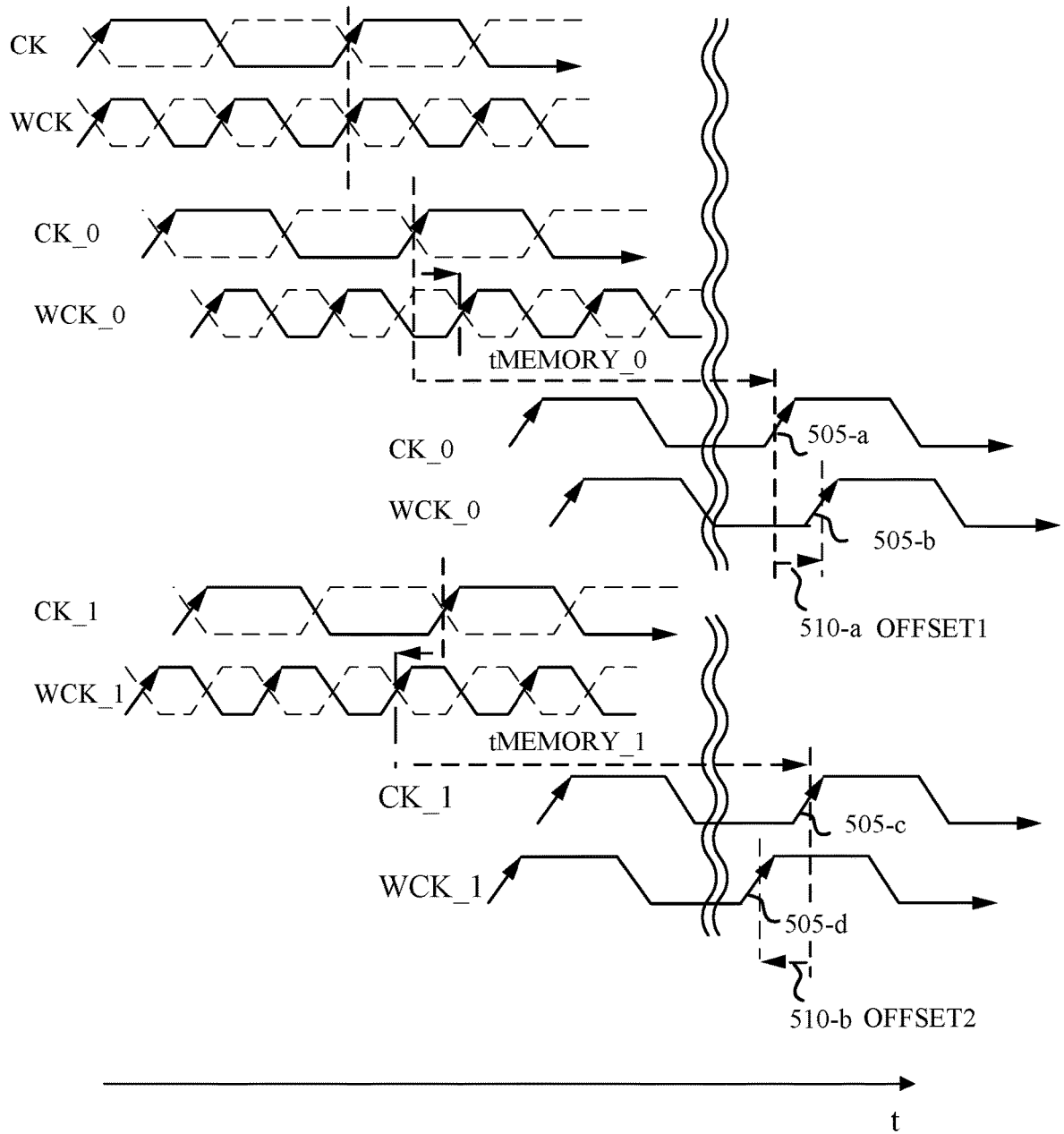
FIG. 5 shows a timing diagram for a system that supports system level timing budget improvements in accordance with aspects of the present disclosure.

FIG. 5 illustrates a signal timing diagram 500 that may depict a timing relationship between the various clocks depicted in the memory system 200 of FIG. 2, including a source data clock signal WCK, first and second data clock signals WCK_0, WCK_1, source system clock signal CK, and first and second system clock signals CK_0, CK_1.

Timing diagram 500 further includes the timing effect of additional phase offsets tMEMORY that may be introduced into the clock signals within each memory die 215; e.g., after the data clock signal WCK and system clock signal CK are received by the memory die. In some cases, each memory die 215 may introduce a different additional offset tMEMORY, due to process variations, signal path differences (e.g., wire or trace length, material, or cross-sectional area differences, etc.). Such differences internal to memory die 215 may cause offsets between a system clock signal CK and a data clock signal WCK to differ, in magnitude and/or polarity, from one memory die 215 to another memory die 215.

In some cases, additionally or alternatively to differences internal to memory die 215, such different offsets from one memory die 215 to another memory die 215 may result entirely or in part from differences in the distribution networks of different system clock signals CK and data clock signals WCK within a memory 205 (e.g., different internal bond wire or other signal path component differences). For example, a first memory die 215-*a* may be physically closer than a second memory die 215-*b* to an input pin associated with a source system clock signal CK, and thus the signal path for a first system clock signal CK_0 received by the first memory die 215-*a* may be physically shorter than the signal path for a second system clock signal CK_1 received by the second memory die 215-*b*. Additionally or alternatively, the first memory die 215-*a* may be physically further than a second memory die 215-*b* from an input pin associated with a source data clock signal WCK, and thus the signal path for a first data clock signal WCK_0 received by the first memory die 215-*a* may be physically longer than the signal path for a second data clock signal WCK_1 received by the second memory die 215-b. Other delay-relevant parameters (e.g., cross-sectional area or fabrication material differences) may similarly differ between die-specific signal paths within a memory 205.

Regardless of cause, as illustrated in the example depicted in FIG. 5A (and unlike in the example depicted in FIG. 4A), the first offset between WCK_0 and CK_0 and the second offset between WCK_1 and CK_1 may be different offsets, including in some cases having different polarities, depending on the different die-specific phase offsets.

In this example, the first offset 510-a and second offset 510-b have different polarities; the first offset 510-a may be a positive offset between the first data clock signal WCK_0 and the first system clock signal CK_0, and the second offset 510-b may be a negative offset between the second data clock signal WCK_1 and the second system clock signal CK_1. Thus, in this case, the rising edge 505-a of the first system clock signal CK_0 occurs before the rising edge 505-b of the first data clock signal WCK_0, while the rising edge 505-c of the second system clock signal CK_1 occurs after the rising edge 505-d of the second data clock signal WCK_1.

The write leveling procedure described with respect to FIGS. 4A-4B may be ineffective in this scenario because adjusting the source system clock signal WCK by a delay may compensate for (or reduce) one of the offsets 510 but may not compensate for (or reduce) the other offset 510. For example, if both the first data clock signal WCK_0 and the second data clock signal WCK_1 are adjusted by a delay that is equivalent to the second offset 510-b (e.g., if they are adjusted by delaying the source data clock signal WCK by an amount of time equal to the magnitude of the second offset 510-b), the second data clock signal WCK_1 and second system clock signal CK_1 may then be phase-aligned, but the first data clock signal WCK_0 and first system clock signal CK_0 may not then be phase-aligned, and in fact may have a larger (in magnitude) offset than before the adjustment.

Thus, in multi-die memory devices where the phase offsets between the data clock signal and the system clock signal may be different for each die 215 in the memory 205, including with potentially have different polarities, it may be difficult to compensate for some or all of the offsets by exclusively adjusting the source data clock signal WCK (or source system clock signal CK). Thus, in some cases, it may be beneficial for one or more of the memory die 215 to adjust its own data clock signal internally; e.g., prior to any write-leveling procedure performed by an external memory controller 105. In some cases, each memory die 215 may include a delay adjuster (e.g., delay adjuster 845 described with respect to FIG. 8) for internally and independently adjusting a data clock signal specific to that memory die 215.

Figure 6:
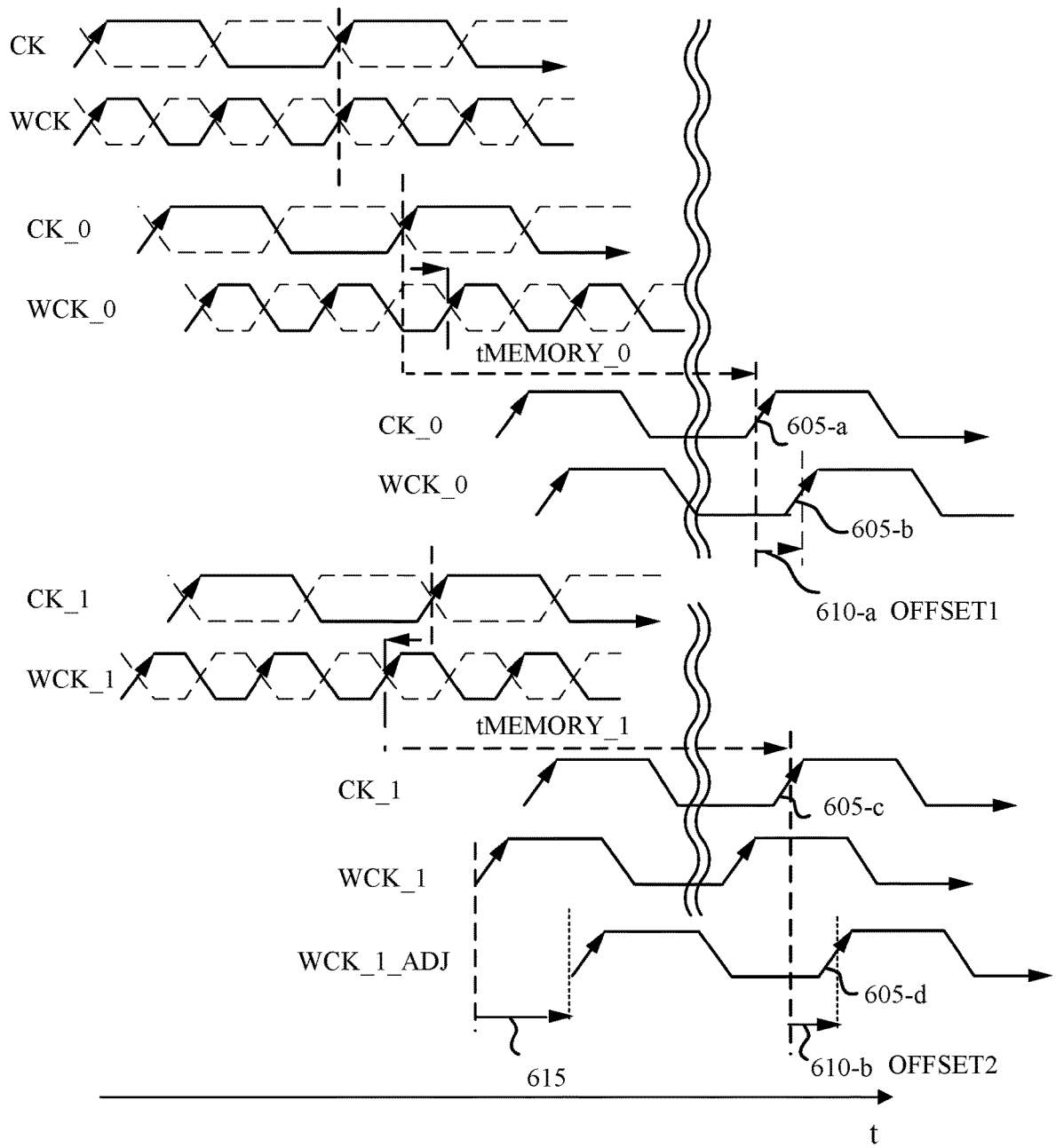
FIG. 6 shows a timing diagram for a system that supports system level timing budget improvements in accordance with aspects of the present disclosure.

FIG. 6 illustrates a signal timing diagram 600 that may depict a timing relationship between the source data clock signal WCK, the first data clock signal WCK_0, the second data clock signal WCK_1, an adjusted second data clock signal WCK_1_ADJ, the source system clock signal CK, and the first and second system clock signals CK_0, CK_1. Timing diagram 600 may depict timing relationships of signals depicted in FIG. 5 after the second data clock signal WCK_1 has been adjusted by a delay 615, thereby becoming adjusted second data clock signal WCK_1_ADJ.

In this example, the second data clock signal WCK_1 has been adjusted by delay 615. Delay 615 may be based on the first offset, the second offset, or both offsets. In this example, delay 615 is based on the sum of the magnitude of the first offset 610-a and the magnitude of the second offset 610-b. As depicted in FIG. 6, adjusting WCK_1 by delay 615 causes the second offset 610-b between the rising edge 605-c of the second system clock to be offset from the rising edge 605-d of the adjusted second system clock WCK_1_ADJ by a second offset 610-b that is substantially the same as the first offset 610-a. That is, adjusting second data clock signal WCK_1 by delay 615 matches the first offset and the second offset in both magnitude and polarity. Once the offsets are matched, one or more of the memory die 215 may transmit an indication of its offset 610 to a memory controller for write-leveling, as described with respect to FIGS. 4A-4B.

While the delay 615 in the example of FIG. 6 is based on a sum of the magnitudes of the first offset and second offset, in other examples, delay 615 may be based on a difference of the magnitudes of the first offset and the second offset. For example, if the first offset and the second offset have the same polarity and different magnitudes (rather than having opposite polarities, as in the example of FIG. 6), delay 615 may be based on a difference in the magnitudes rather than on a sum of the magnitudes. A person of skill in the art will recognize that there are multiple ways of determining a delay based on a first offset and a second offset in order to conform or compensate for the two offsets.

Figure 7:
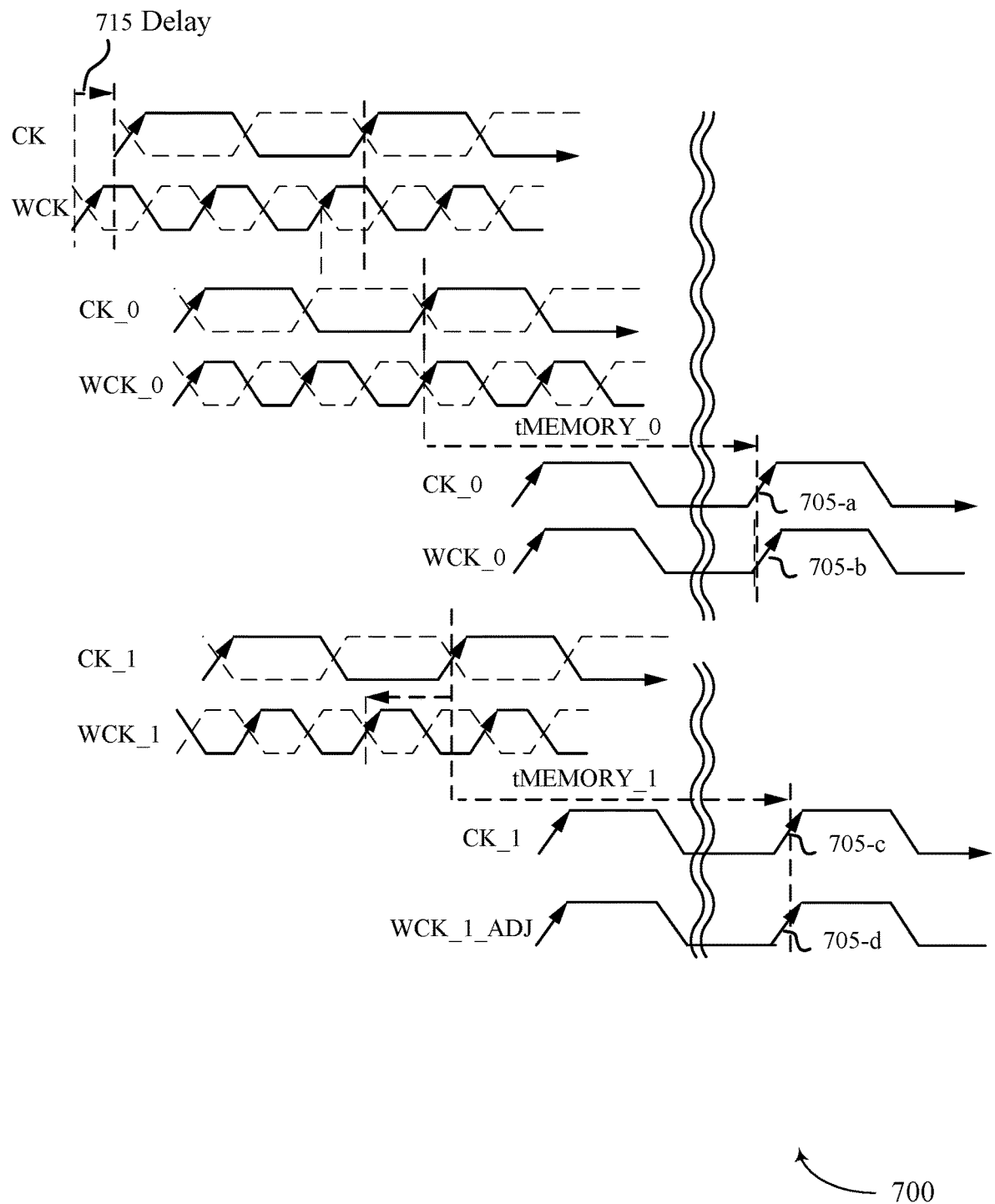
FIG. 7 shows a timing diagram for a system that supports system level timing budget improvements in accordance with aspects of the present disclosure.

FIG. 7 illustrates a signal timing diagram 700 that may depict a timing relationship between the source data clock signal WCK, the first data clock signal WCK_0, the adjusted second data clock signal WCK_1_ADJ, the source system clock signal CK, and the first and second system clock signals CK_0, CK_1. Timing diagram 700 may depict timing relationships of signals depicted in FIG. 6 after a write-leveling procedure (e.g., after an adjustment of a source data clock WCK).

In this example, external memory controller 105 may receive, from the first memory die 215-a and/or the second memory die 215-b, an indication of the first offset 610-a and/or the second offset 610-b, which have been conformed to match each other as described with reference to FIG. 6. External memory controller 105 may adjust the source data clock signal WCK by delay 715 to compensate for offsets 610-a, 610-b. External memory controller 105 may determine delay 715 based on first offset 610-a and/or second offset 610-b. In some cases, delay 715 may have the same magnitude as offset 610-a, 610-b to compensate for offsets 610-a, 610-b.

In this example, adjusting WCK by delay 715 also adjusts (e.g., delays) the first data clock signal WCK_0, the second data clock signal WCK_1, and the adjusted second data clock signal WCK_1_ADJ relative to the timing depicted in FIG. 6 such that the first data clock signal WCK_0 and first system clock signal CK_0 are phase-aligned, and the adjusted second data clock signal WCK_1 and the second system clock signal CK_1 are phase-aligned (e.g., rising edges 705 are phase-aligned).

While the examples discussed with respect to FIGS. 2-7 depict a memory having two memory die 215-a, 215-b, the techniques described above for system-level timing budget improvements may be extended to memories having three or more memory die.

In some examples, for memories 205 that include multiple memory dice 215, each die may adjust its internal data clock signal (e.g., WCK_0, WCK_1, WCK_2, etc.) by a delay that is determined based on the WCK/CK offsets of each die. In some cases, each delay may be determined based on a determined minimum or maximum offset of each of the offsets; e.g., based on the offset having the minimum or maximum magnitude.

In some examples, each die may adjust its internal data clock signal by the same delay; e.g., a delay based on or equal to the minimum or maximum offset of the multiple dice. In some examples, each die may adjust its internal data clock signal by a different delay, and each such delay may be determined based on some or all of the offsets of each of the die in the memory. For example, each respective die may adjust its internal data clock signal WCK independently based on the sum or difference of the magnitude of the respective die's WCK/CK offset and the magnitude of the minimum or maximum offset.

For example, in some cases the internal data clock signal WCK of each die may lag the corresponding system clock signal CK, the offset of the internal data clock signal WCK with the greatest (largest amount of) lag (e.g., maximum magnitude lagging offset) may be identified as a baseline (target) offset. Each other internal data clock signal WCK may be internally adjusted to have equal lag relative to the corresponding system clock signal CK, and global write-leveling may occur. Thus, in some cases each other internal data clock signal WCK may be internally adjusted based on the difference between the magnitude of its offset and the magnitude of a baseline maximum offset.

As another example, in some cases the internal data clock signal WCK of each die may lead the corresponding system clock signal CK, the offset of the internal data clock signal WCK with the least (smallest amount of) lead (e.g., minimum magnitude leading offset) may be identified as a baseline (target) offset. Each other internal data clock signal WCK may be internally adjusted to have equal lead relative to the corresponding system clock signal CK, and global write-leveling may occur. Thus, in some cases each other internal data clock signal WCK may be internally adjusted based on the difference between the magnitude of its offset and the magnitude of a baseline minimum offset.

As another example, in some cases the internal data clock signal WCK of one or more dies may lag the corresponding system clock signal CK, while the internal data clock signal WCK of one or more other dies may lead the corresponding system clock signal CK, the offset of the internal data clock signal WCK with the greatest lag (e.g., maximum magnitude lagging offset) may be identified as a baseline (target) offset. The adjustment of the internal data clock signal WCK for a die may depend on whether the die's internal data clock signal WCK is lagging or leading the corresponding system clock signal CK. If a first other die has a lagging offset smaller than the baseline offset, then the internal data clock signal WCK for the first other die may be internally adjusted based on the difference between the magnitude of its offset and the magnitude of the baseline maximum offset, to conform the offset of the first other die with the baseline offset. If, however, a second other die has a leading offset, then the internal data clock signal WCK for the second other die may be internally adjusted based on the sum between the magnitude of its offset and the magnitude of the baseline maximum offset, to conform the offset of the first other die with the baseline offset. Thus, in some cases an internal data clock signal WCK may be internally adjusted based on the sum of or the difference between the magnitude of its offset and the magnitude of a baseline offset (e.g., a baseline maximum offset).

In some cases, a controller (e.g., a memory controller 105 or device memory controller 155) may identify a baseline (target) offset based on the relationship (e.g., lagging or leading) between each internal data clock signal WCK of one or more dies and the corresponding system clock signal CK and may coordinate internal adjustments and global write-leveling as described herein.

Figure 8:
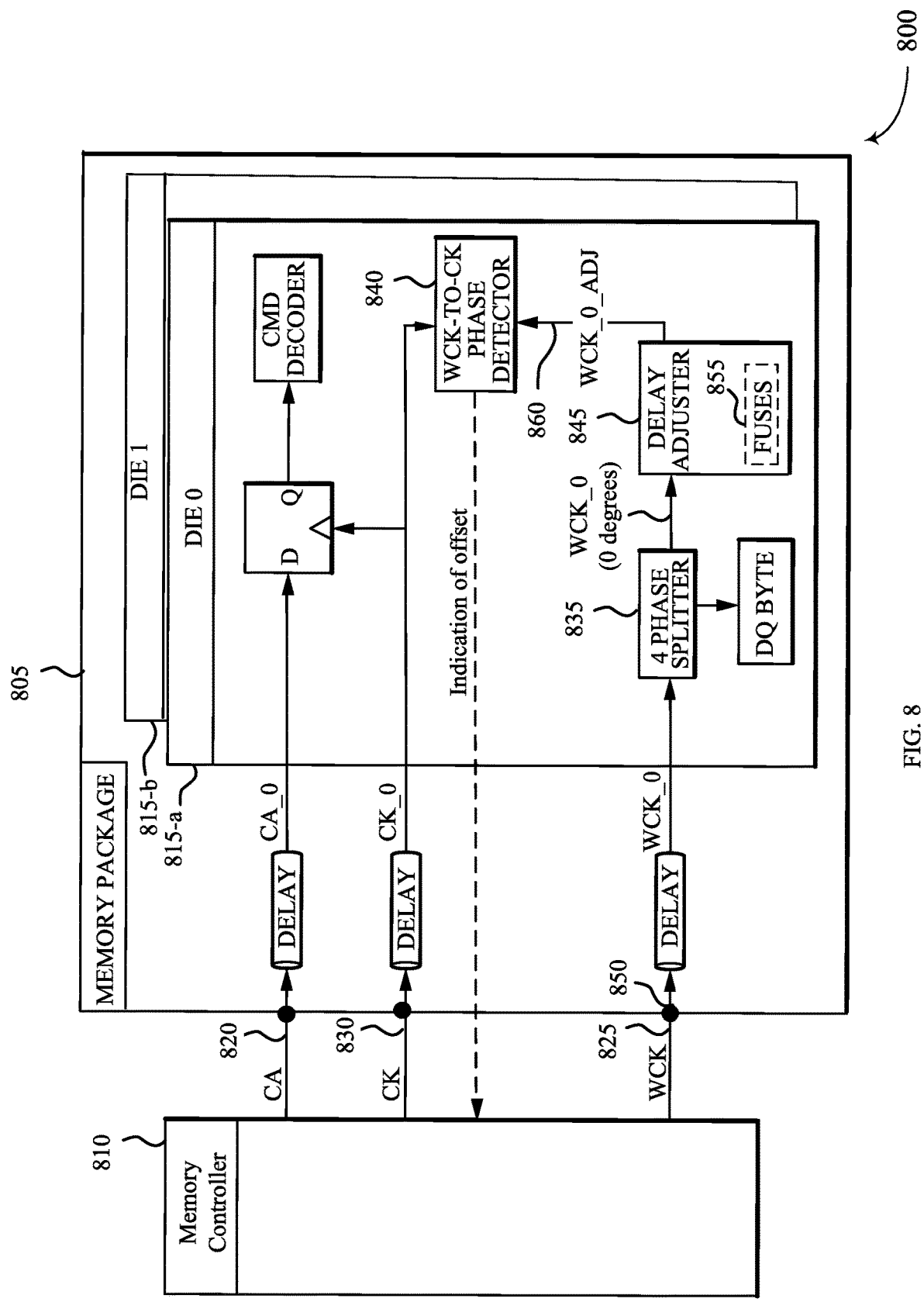
FIG. 8 shows a block diagram of a device that supports system level timing budget improvements in accordance with aspects of the present disclosure.

FIG. 8 depicts an example of a memory system 800 that supports system-level timing budget improvements. Memory system 800 includes a memory 805 and memory controller 810. Memory 805 may be an example of memory device 110, and memory controller 810 may be an example of external memory controller 105, device memory controller 155, and/or local memory controller 165 as discussed with reference to FIG. 1.

Memory 805 includes multiple memory dice 815 that may be an example of a memory die 160, 215 discussed with respect to FIGS. 1-2. While memory 805 is depicted with two memory die 815-*a*, 815-*b*, a person of skill in the art will recognize that memory 805 may include a greater number of memory die 815.

In some examples, memory controller 810 may generate a command and address (CA) signal that may be transmitted on a command and address channel 820, as discussed with respect to external memory controller 105 FIG. 1.

Memory controller 810 may generate a source data clock signal WCK that may be transmitted on a source data clock channel 825 and a source system clock signal CK that may be transmitted on a source system clock channel 830. Memory controller 810 may be coupled with one or more memory die 815. Each memory die 815 may receive a data clock signal (e.g., WCK_0, WCK_1) and system clock signal (e.g., CK_0, CK_1) that are based on the source data clock signal WCK and source system clock signal CK, respectively.

Each memory die 815 optionally includes a four-phase splitter 835 that may split the data clock signal WCK_0 into four phases: a 0-degree phase, a 45-degree phase, a 90-degree phase, and a 180-degree phase. In some examples, determining a WCK/CK offset (e.g., between a rising edge of WCK_0 and a rising edge of CK_0, as discussed with respect to FIGS. 3-7) may be based on determining an offset between a rising edge of the 0-degree phase of WCK_0 (e.g., as produced by the phase splitter 835) and a rising edge of CK_0.

Each memory die 815 may include a phase detector 840 for detecting an offset between a data clock signal WCK_0 or an adjusted data clock signal WCK_0_ADJ and a system clock signal CK_0. Memory die 815 may route an adjusted data clock signal WCK_0_ADJ 860 and system clock signal CK_0 to phase detector 840. In some cases, memory die 815 may transmit an indication of the detected offset (e.g., the offset detected by phase detector 840) to memory controller 810.

Each memory die 815 may include a delay adjuster 845 configured to adjust a first data clock signal WCK_0 by a delay that is based on a first offset between a first data clock signal WCK_0 and a first system clock signal CK_0 and a second offset between a second data clock signal WCK_1 and a second system clock signal CK_1. Delay adjuster 845 may be configured to generate an adjusted data clock signal WCK_0_ADJ 860 by adjusting the data clock signal WCK_0. In some examples, adjusting the first data clock signal (e.g., WCK_0) may adjust the first offset to conform the first offset to the second offset (e.g., to have the first offset match the second offset). In some examples, the delay is based on a sum or a difference of a magnitude of the first offset and a magnitude of the second offset. In some examples, the delay adjuster 845 is configured to adjust the first data clock signal WCK_0 based on a determination that the first offset is an opposite polarity of the second offset.

In some examples, the delay adjuster 845 may be configured to adjust the first data clock signal using circuitry that includes a series of logic gates. In some examples, the delay adjuster 845 may include multiple fuses 855 that may each be associated with different circuitry that includes a different series of logic gates (e.g., inverters, NAND gates, and the like); thus, each fuse may be associated with a different delay. In some examples, a delay adjuster may be configured to adjust a data clock signal by selecting one of the multiple fuses 855 based on its associated delay, and setting (e.g., triggering, blowing, activating) the fuse. In some cases, the remaining fuses may not be set.

In some cases, a fuse (e.g., one of fuses 855) may be selected and set during a post-fabrication test process, for example. In some cases, such a test process may include routing a first data clock signal and a first system clock signal to a first memory die 815-*a* (e.g., from memory controller 810). The test process may include routing a second data clock signal and a second system clock signal to a second memory die 815-*b* (e.g., from memory controller 810). A phase detector 840 on each die 815 may detect a first offset and a second offset between the first data clock signal and first system clock signal, and the second data clock signal and second system clock signal, respectively. Based on the first offset and the second offset, a fuse may be selected and set in the first delay adjuster and/or the second delay adjuster to adjust the first data clock signal and/or the second data clock signal by a respective delay; e.g., to match the first offset with the second offset.

In some examples, setting a fuse in delay adjuster 845 establishes a conductive path between a port 850 (e.g., a pin) at which the source data clock is received and delay adjuster 845 (possibly by way of optional phase splitter 835) in order to permit the delay adjuster to adjust a data clock signal (e.g., WCK_0) and generate an adjusted data clock signal (e.g., WCK_0_ADJ), which may be received by phase detector 840.

In some examples, a delay adjuster may be configurable to select a delay amount based on an indication of a delay received from, for example, memory controller 810. In some cases, the indication of the delay may be received by a memory die via a register whose value is set by the memory controller, for example. In some cases, the delay adjuster may be configured to adjust the delay based on the received indication of the delay. For example, the delay adjuster may include configurable circuitry that may be dynamically configured based on the received indication of the delay. In this case, the delay may be dynamically adjusted during operation of the memory system, rather than set (e.g., hardwired) via fuses during a post-fabrication testing procedure.

Figure 9:
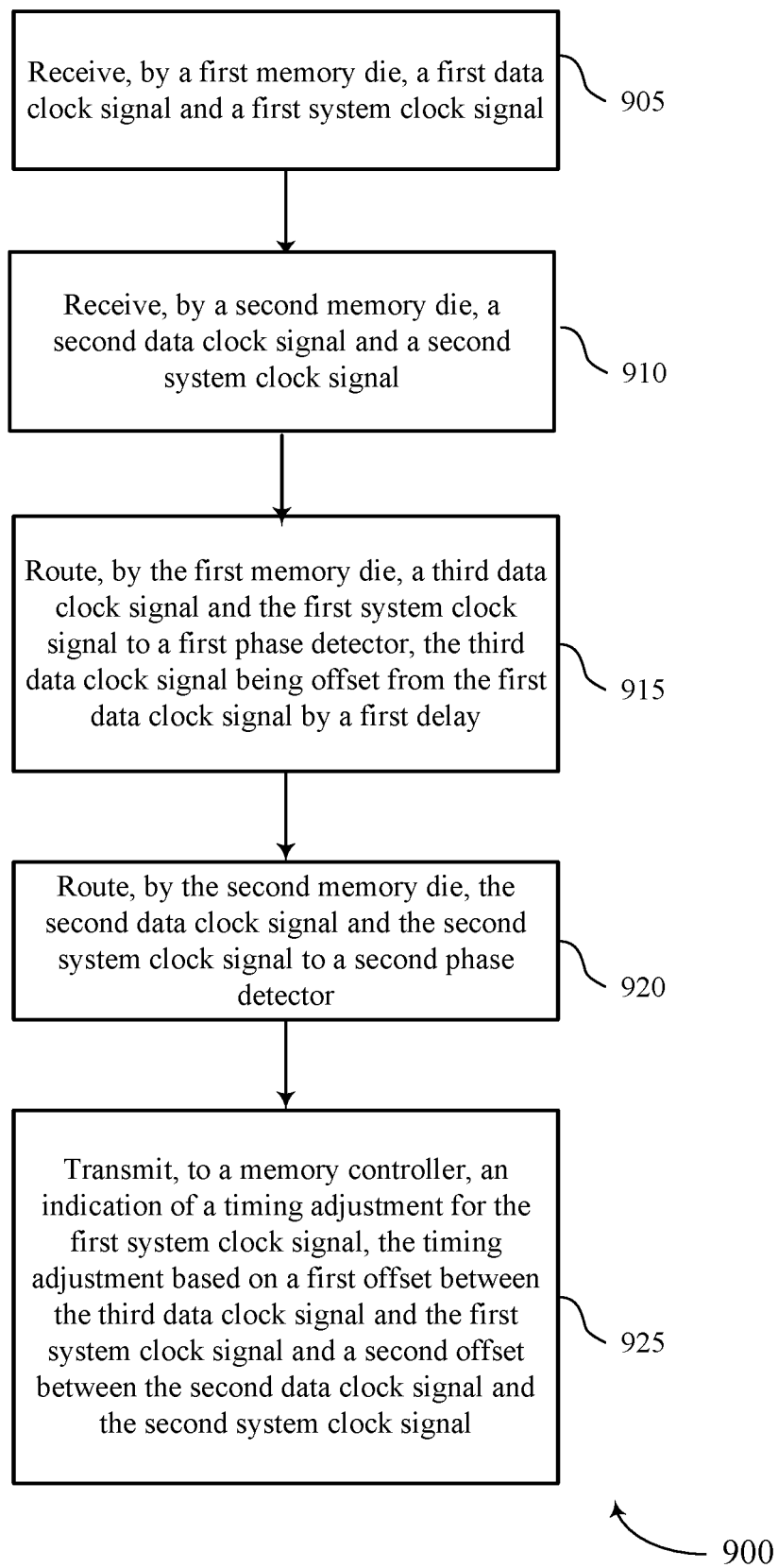
FIG. 9 shows a process flow that supports system level timing budget improvements in accordance with aspects of the present disclosure.

FIG. 9 shows a flowchart illustrating a method 900 that supports system level timing budget improvements in accordance with aspects of the present disclosure. The operations of method 900 may be implemented by a memory system (e.g., memory system 100, 200, 800) or its components as described herein. For example, some operations of method 900 may be performed by a memory controller (e.g., memory controller 210, 810, external memory controller 105, device memory controller 155, local memory controller 165) and/or one or more memory die (e.g., memory die 160, 215, 815) as described with reference to FIGS. 1-8. In some examples, a processor (e.g., processor 120) may execute a set of instructions to control the functional elements of the memory controller or other aspects of a memory device or system that includes the memory device to perform some of the functions described below. Additionally or alternatively, a memory system may perform aspects of the functions described below using special-purpose hardware.

At 905, the method may include receiving, by a first memory die, a first data clock signal (e.g., WCK_1) and a first system clock signal (e.g., CK_1). The memory die may receive the first data clock and first system clock signal from a memory controller, for example, via one or more input ports (e.g., pins). In some examples, aspects of the operations of 905 may be performed as described with reference to FIGS. 1-8.

At 910, the method may include receiving, by the first memory die, a second data clock signal (e.g., WCK_0) and a second system clock signal (e.g., CK_0). The memory die may receive the second data clock signal and second system clock signal from a memory controller, for example, via one or more input ports (e.g., pins). In some examples, aspects of the operations of 910 may be performed as described with reference to FIGS. 1-8.

At 915, the method may include routing, by the first memory die, a third data clock signal (e.g., WCK_1_ADJ) and the first system clock signal (e.g., CK_1) to a first phase detector (e.g., phase detector 840), the third data clock signal being offset from the first data clock signal by a first offset (e.g., offset 605-*b*). In some examples, aspects of the operations of 915 may be performed as described with reference to FIGS. 1-8.

At 920, the method may include routing, by the second memory die, the second data clock signal (e.g., WCK_0) and the second system clock signal (e.g., CK_0) to a second phase detector. In some examples, aspects of the operations of 920 may be performed as described with reference to FIGS. 1-8.

At 925, the method may include transmitting, to a memory controller, an indication of a timing adjustment for the first system clock signal, the timing adjustment based on a first offset (e.g., 610-*b*) between the third data clock signal and the first system clock signal and/or a second offset (e.g., 610-*a*) between the second data clock signal and the second system clock signal. In some examples, aspects of the operations of 925 may be performed as described with reference to FIGS. 1-8.

In some examples, an apparatus may perform a method or methods as described herein, such as the method 900, using general- or special-purpose hardware. The apparatus may include features, means, or instructions for receiving, by a first memory die, a first data clock signal and a first system clock signal; receiving, by a second memory die, a second data clock signal and a second system clock signal; routing, by the first memory die, a third data clock signal and the first system clock signal to a first phase detector, the third data clock signal being offset from the first data clock signal by a first delay; routing, by the second memory die, the second data clock signal and the second system clock signal to a second phase detector; and transmitting, to a memory controller, an indication of a timing adjustment for the first system clock signal, the timing adjustment based at least in part on a first offset between the third data clock signal and the first system clock signal and a second offset between the second data clock signal and the second system clock signal. In some examples, transmitting the indication of the timing adjustment includes transmitting an indication of the first offset, transmitting an indication of the second offset, or any combination thereof.

Some examples of the method 900 and apparatuses described herein may further include processes, features, means, or instructions for receiving the first data clock signal from the memory controller and receiving, by the first memory die, an adjusted first data clock signal from the memory controller, wherein the adjusted first data clock signal is offset from the first data clock signal by the first offset.

Some examples of the method 900 and apparatuses described herein may further include processes, features, means, or instructions for receiving, by a third memory die, a fourth data clock signal and a third system clock signal; routing, by the third memory die, a fifth data clock signal and the third system clock signal to a third phase detector, the fifth data clock signal being offset from the fourth data clock signal by the first delay; routing, by the third phase detector to the memory controller, an indication of a third offset between the fifth data clock signal and the third system clock signal.

Some examples of the method 900 and apparatuses described herein may further include processes, features, means, or instructions for routing, by the first memory die, the first data clock signal to a first delay adjuster configured to generate the third data clock signal by adjusting the first data clock signal by the first delay; and receiving, by the first memory die, the third data clock signal from the first delay adjuster.

Figure 10:
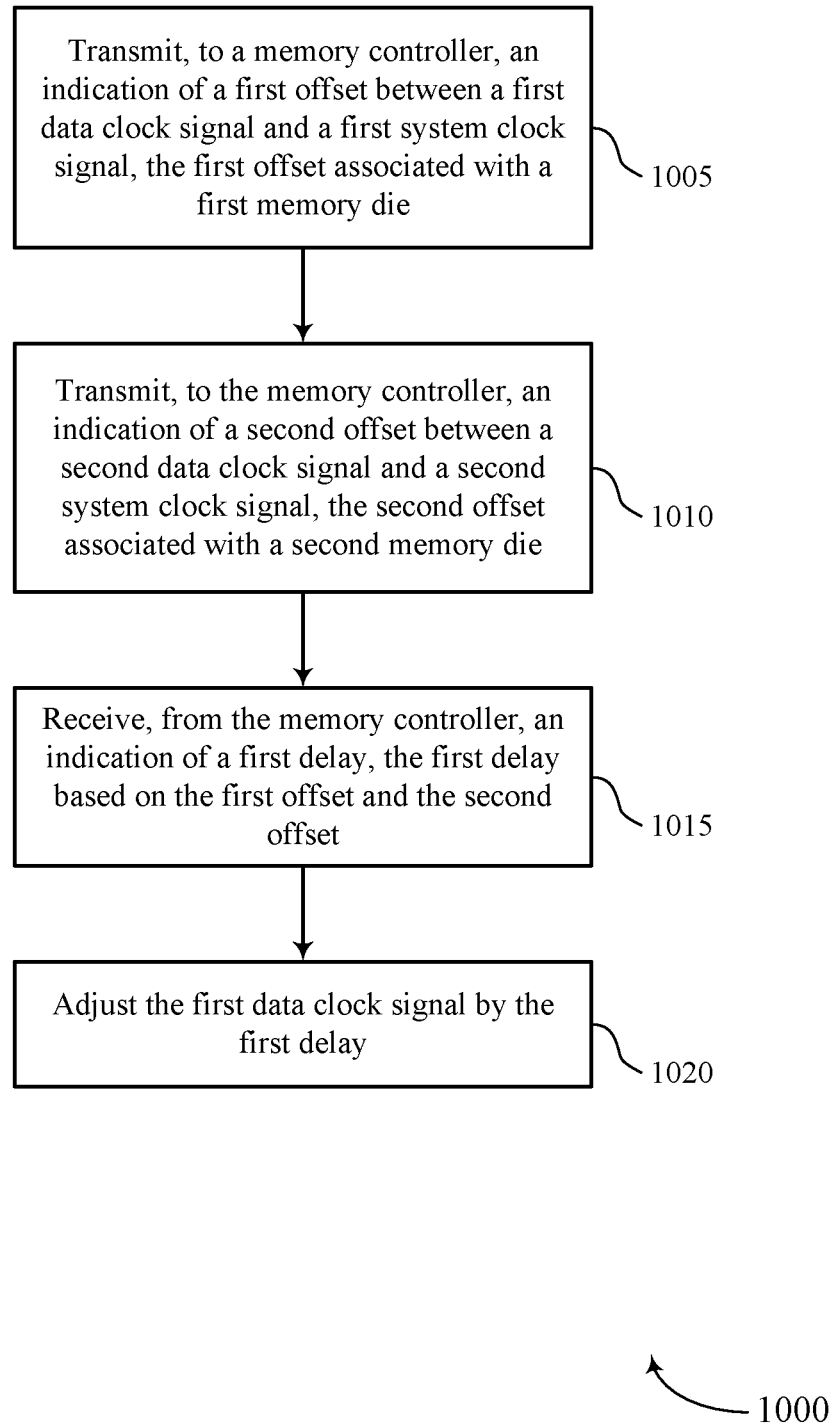
FIG. 10 shows a process flow that supports system level timing budget improvements in accordance with aspects of the present disclosure.

FIG. 10 shows a flowchart illustrating a method 1000 that supports system level timing budget improvements in accordance with aspects of the present disclosure. The operations of method 1000 may be implemented by a memory system (e.g., memory system 100, 200, 800) or its components as described herein. For example, some operations of method 1000 may be performed by a memory controller (e.g., memory controller 210, 810, external memory controller 105, device memory controller 155, local memory controller 165) and/or one or more memory die (e.g., memory die 160, 215, 815) as described with reference to FIGS. 1-8. In some examples, a processor (e.g., processor 120) may execute a set of instructions to control the functional elements of the memory controller or other aspects of a memory device or system that includes the memory device to perform some of the functions described below. Additionally or alternatively, a memory system may perform aspects of the functions described below using special-purpose hardware.

At 1005, the method may include transmitting, to a memory controller, an indication of a first offset (e.g., offset 510-*a*) between a first data clock signal (e.g., WCK_1) and a first system clock signal (e.g., CK_1), the first offset associated with a first memory die. In some cases, the indication may be or represent the first offset as detected by a phase detector 840, for example. In some examples, aspects of the operations of 1005 may be performed as described with reference to FIGS. 1-8.

At 1010, the method may include transmitting, to the memory controller, an indication of a second offset (e.g., offset 510-*b*) between a second data clock signal (e.g., WCK_0) and a second system clock signal (e.g., CK_0), the second offset associated with a second memory die. In some examples, aspects of the operations of 1010 may be performed as described with reference to FIGS. 1-8.

At 1015, the method may include receiving, from the memory controller, an indication of a first delay (e.g., delay 615), the first delay based on the first offset and the second offset. In some cases, the indication of the delay may be received by a memory die via a register whose value is set by the memory controller, for example. In some examples, aspects of the operations of 1015 may be performed as described with reference to FIGS. 1-8.

At 1020, the method may include adjusting the first data clock signal (e.g., WCK_1) by the first delay. In some examples, adjusting the first data clock signal by the first delay generates an adjusted first data clock signal (e.g., WCK_1_ADJ). In some cases, the first data clock signal is adjusted by a delay adjuster (e.g., delay adjuster 845). In some examples, aspects of the operations of 1020 may be performed as described with reference to FIGS. 1-8.

In some examples, an apparatus may perform a method or methods as described herein, such as the method 1000, using general- or special-purpose hardware. The apparatus may include features, means, or instructions for transmitting, to a memory controller, an indication of a first offset between a first data clock signal and a first system clock signal, the first offset associated with a first memory die; transmitting, to the memory controller, an indication of a second offset between a second data clock signal and a second system clock signal, the second offset associated with a second memory die; receiving, from the memory controller, an indication of a first delay, the first delay based at least in part on the first offset and the second offset; and adjusting the first data clock signal by the first delay.

Some examples of the method 1000 and apparatuses described herein may further include processes, features, means, or instructions for receiving, from the memory controller, a source data clock signal and a source system clock signal, wherein the first data clock signal and the second data clock signal are based on the source data clock signal, and wherein the first system clock signal and the second system clock signal are based on the source system clock signal.

Some examples of the method 1000 and apparatuses described herein may further include processes, features, means, or instructions for routing the indication of the first delay to a first delay adjuster configured to adjust the first data clock signal by the first delay; and routing the first data clock signal to the first delay adjuster.

Some examples of the method 1000 and apparatuses described herein may further include processes, features, means, or instructions for receiving the adjusted first data clock signal from the first delay adjuster; detecting a third offset between the adjusted first data clock signal and the first system clock signal; and routing the third offset to the memory controller.

In some cases, the first data clock signal is received from the memory controller at a first port of the first memory die, and some examples of the method 1000 and apparatuses described herein may further include processes, features, means, or instructions for receiving, from the memory controller at the first port, a third data clock signal from the memory controller, wherein the third data clock signal is offset from the first data clock signal by the third offset.

Figure 11:
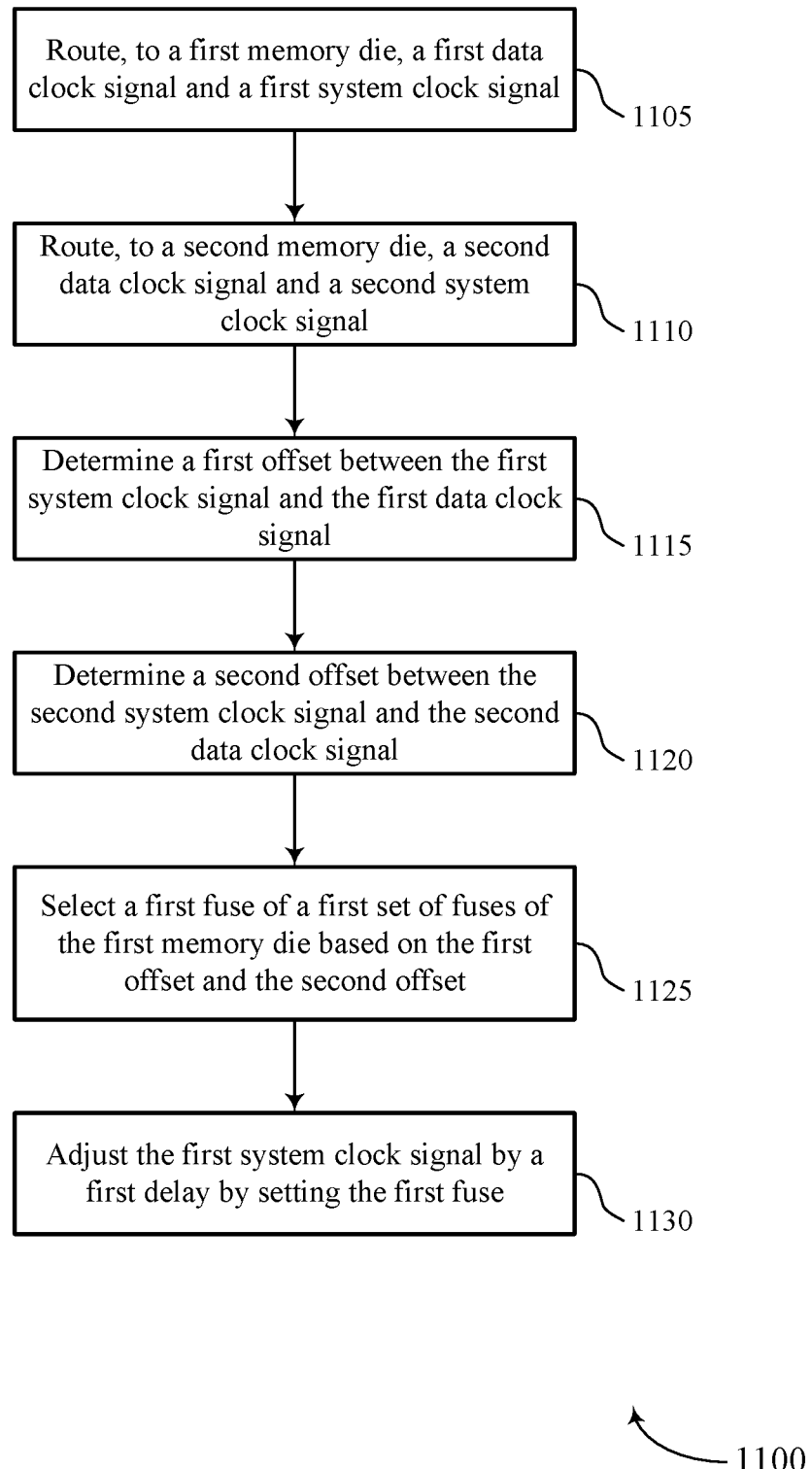
FIG. 11 shows a process flow that supports system level timing budget improvements in accordance with aspects of the present disclosure.

FIG. 11 shows a flowchart illustrating a method 1100 that supports system level timing budget improvements in accordance with aspects of the present disclosure. The operations of method 1100 may be implemented by a memory system (e.g., memory system 100, 200, 800) or its components as described herein. For example, some operations of method 1100 may be performed by a memory controller (e.g., memory controller 210, 810, external memory controller 105, device memory controller 155, local memory controller 165) and/or one or more memory die (e.g., memory die 160, 215, 815) as described with reference to FIGS. 1-8. In some examples, a processor (e.g., processor 120) may execute a set of instructions to control the functional elements of the memory controller or other aspects of a memory device or system that includes the memory device to perform some of the functions described below. Additionally or alternatively, a memory system may perform aspects of the functions described below using special-purpose hardware.

At 1105, the method may include routing, to a first memory die, a first data clock signal (e.g., WCK_1) and a first system clock signal (e.g., CK_1). In some cases, the first data clock signal and/or first system clock signal may be routed to the memory die from a memory controller, and may be based on a source data clock signal (WCK) and source system clock signal (CK), respectively, that are generated by the memory controller. In some examples, aspects of the operations of 1105 may be performed as described with reference to FIGS. 1-8.

At 1110, the method may include routing, to a second memory die, a second data clock signal (e.g., WCK_0) and a second system clock signal (e.g., CK_0). In some cases, the second data clock signal and/or second system clock signal may be routed to the memory die from the memory controller, and may be based on a source data clock signal (WCK) and source system clock signal (CK), respectively, that are generated by the memory controller. In some examples, aspects of the operations of 1110 may be performed as described with reference to FIGS. 1-8.

At 1115, the method may include determining a first offset (e.g., offset 510-*b*) between the first system clock signal and the first data clock signal. In some cases, the first offset may be determined using a first phase detector on the first memory die (e.g., phase detector 840). In some examples, aspects of the operations of 1115 may be performed as described with reference to FIGS. 1-8.

At 1120, the method may include determining a second offset (e.g., offset 510-*a*) between the second system clock signal and the second data clock signal. In some cases, the first offset may be determined using a second phase detector on the second memory die. In some examples, aspects of the operations of 1120 may be performed as described with reference to FIGS. 1-8.

At 1125, the method may include selecting a first fuse of a first set of fuses of the first memory die based on the first offset and the second offset. In some cases, the first fuse may be associated with a first delay (e.g., delay 615). In some cases, the first fuse may be selected manually (e.g., by a user) or automatically (e.g., by processor 120, external memory controller 105, and/or another component in memory system 100). In some cases, the first fuse is selected to match the first offset to the second offset by delaying the first data clock signal (e.g., WCK_1) by the first delay. In some examples, aspects of the operations of 1125 may be performed as described with reference to FIGS. 1-8.

At 1130, the method may include adjusting the first data clock signal (e.g., WCK_1) by a first delay (e.g., delay 615) by setting the first fuse. In some cases, setting the first fuse adjusts the first data clock signal by coupling the first data clock signal with delay circuitry in a delay adjuster (e.g., delay adjuster 845). In some examples, aspects of the operations of 1130 may be performed as described with reference to FIGS. 1-8.

In some examples, an apparatus may perform a method or methods as described herein, such as the method 1100, using general- or special-purpose hardware. The apparatus may include features, means, or instructions for routing, to a first memory die, a first data clock signal and a first system clock signal; routing, to a second memory die, a second data clock signal and a second system clock signal; determining a first offset between the first system clock signal and the first data clock signal; determining a second offset between the second system clock signal and the second data clock signal; selecting a first fuse of a first plurality of fuses of the first memory die based at least in part on the first offset and the second offset; and adjusting the first data clock signal by a first delay by setting the first fuse.

In some cases, adjusting the first data clock signal by the first delay includes conforming the first offset to the second offset.

Some examples of the method 1100 and apparatuses described herein may further include processes, features, means, or instructions for routing, to a third memory die, a third data clock signal and a third system clock signal, determining a third offset between the third system clock signal and the third data clock signal; selecting a second fuse of a second plurality of fuses of the third memory die based at least in part on a maximum of the first offset, the second offset, and the third offset; and adjusting the third data clock signal by the first delay by setting the second fuse.

It should be noted that the methods described above describe possible implementations, and that the operations and the steps may be rearranged or otherwise modified and that other implementations are possible. Further, embodiments from two or more of the methods may be combined.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal; however, it will be understood by a person of ordinary skill in the art that the signal may represent a bus of signals, where the bus may have a variety of bit widths.

The terms "electronic communication," "conductive contact," "connected," and "coupled" may refer to a relationship between components that supports the flow of electrons between the components. Components are considered in electronic communication with (or in conductive contact with or connected with or coupled with) one another if there is any conductive path between the components that can, at any time, support the flow of electrons between the components. At any given time, the conductive path between components that are in electronic communication with each other (or in conductive contact with or connected with or coupled with) may be an open circuit or a closed circuit based on the operation of the device that includes the connected components. The conductive path between connected components may be a direct conductive path between the components or the conductive path between connected components may be an indirect conductive path that may include intermediate components, such as switches, transistors, or other components. In some cases, the flow of electrons between the connected components may be interrupted for a time, for example, using one or more intermediate components such as switches or transistors.

The term "coupling" refers to condition of moving from an open-circuit relationship between components in which electrons are not presently capable of flowing between the components over a conductive path to a closed-circuit relationship between components in which electronic are capable of flowing between components over the conductive path. When a component, such as a controller, couples other components together, the component initiates a change that allows electrons to flow between the other components over a conductive path that previously did not permit electrons to flow.

As used herein, the term "substantially" means that the modified characteristic (e.g., a verb or adjective modified by the term substantially) need not be absolute but is close enough so as to achieve the advantages of the characteristic.

The devices discussed herein, including a memory array, may be formed on a semiconductor substrate, such as silicon, germanium, silicon-germanium alloy, gallium arsenide, gallium nitride, etc. In some cases, the substrate is a semiconductor wafer. In other cases, the substrate may be a silicon-on-insulator (SOI) substrate, such as silicon-on-glass (SOG) or silicon-on-sapphire (SOP), or epitaxial layers of semiconductor materials on another substrate. The conductivity of the substrate, or sub-regions of the substrate, may be controlled through doping using various chemical species including, but not limited to, phosphorous, boron, or arsenic. Doping may be performed during the initial formation or growth of the substrate, by ion-implantation, or by any other doping means.

A switching component or a transistor discussed herein may represent a field-effect transistor (FET) and include a three terminal device including a source, drain, and gate. The terminals may be connected to other electronic elements through conductive materials, e.g., metals. The source and drain may be conductive and may include a heavily-doped, e.g., degenerate, semiconductor region. The source and drain may be separated by a lightly-doped semiconductor region or channel. If the channel is n-type (i.e., majority carriers are electrons), then the FET may be referred to as a n-type FET. If the channel is p-type (i.e., majority carriers are holes), then the FET may be referred to as a p-type FET. The channel may be capped by an insulating gate oxide. The channel conductivity may be controlled by applying a voltage to the gate. For example, applying a positive voltage or negative voltage to an n-type FET or a p-type FET, respectively, may result in the channel becoming conductive. A transistor may be "on" or "activated" when a voltage greater than or equal to the transistor's threshold voltage is applied to the transistor gate. The transistor may be "off" or "deactivated" when a voltage less than the transistor's threshold voltage is applied to the transistor gate.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label.

Information and signals described herein may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The various illustrative blocks and modules described in connection with the disclosure herein may be implemented or performed with a general-purpose processor, a DSP, an ASIC, an FPGA or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a digital signal processor (DSP) and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described above can be implemented using software executed by a processor, hardware, firmware, hardwiring, or combinations of any of these. Features implementing functions may also be physically located at various positions, including being distributed such that portions of functions are implemented at different physical locations. Also, as used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:
1. An apparatus, comprising:
   a memory die configured to receive a system clock signal and a data clock signal, wherein the memory die comprises:
     a first fuse configured to receive at least a portion of the data clock signal;
     a first plurality of logic gates coupled with the first fuse and configured to delay the at least the portion of the data clock signal by a first delay amount;
     a second fuse configured to receive the at least the portion of the data clock signal; and a second plurality of logic gates coupled with the second fuse and configured to delay the at least the portion of the data clock signal by a second delay amount different than the first delay amount.

2. The apparatus of claim 1, wherein the first fuse couples the at least the portion of the data clock signal with the first plurality of logic gates such that the data clock signal is delayed by the first delay amount to generate an adjusted data clock signal.

3. The apparatus of claim 2, wherein the memory die further comprises:
a phase detector coupled with the first plurality of logic gates and the second plurality of logic gates, the phase detector configured to:
receive the system clock signal and the adjusted data clock signal;
determine an offset between the system clock signal and the adjusted data clock signal; and
output an indication of the offset.

4. The apparatus of claim 2, wherein the first fuse is blown and wherein the second fuse is not blown.

5. The apparatus of claim 2, wherein the memory die is configured to synchronize memory access operations of the memory die based at least in part on the adjusted data clock signal.

6. The apparatus of claim 1, wherein the memory die further comprises:
a phase splitter coupled with the first fuse and the second fuse, the phase splitter configured to:
receive the data clock signal;
split the data clock signal into a plurality of phases; and
provide at least a first phase of the plurality of phases to the first fuse and the second fuse, wherein the at least the portion of the data clock signal comprises the at least the first phase.

7. The apparatus of claim 6, wherein the first phase is a 0-degree phase.

8. The apparatus of claim 6, further comprising:
a first port for receiving the data clock signal, wherein the first port is coupled with the phase splitter; and
a second port for receiving the system clock signal.

9. The apparatus of claim 8, wherein the first port and the second port are coupled with a controller configured to provide the data clock signal and the system clock signal to the memory die.

10. The apparatus of claim 8, further comprising:
a second memory die coupled with the first port and the second port, wherein the second memory die is configured to receive the data clock signal and the system clock signal.

11. An apparatus, comprising:
a memory die configured to receive a system clock signal, a data clock signal, and an indication of a delay,
wherein the memory die comprises a delay adjuster configured to delay, in response to receiving the indication of the delay, the data clock signal to generate an adjusted data clock signal, and wherein the delay is based at least in part on an offset, determined at the memory die, between the system clock signal and the data clock signal.

12. The apparatus of claim 11, wherein the delay adjuster comprises:
a switch configured to receive at least a portion of the data clock signal and the indication of the delay;
first circuitry coupled with the switch and configured to delay the at least the portion of the data clock signal by a first delay amount; and
second circuitry coupled with the switch and configured to delay the at least the portion of the data clock signal by a second delay amount different than the first delay amount,
wherein the switch is configured to provide the data clock signal to the first circuitry or the second circuitry based at least in part on the indication of the delay to cause the first circuitry or the second circuitry to generate the adjusted data clock signal, and
wherein the memory die is configured to synchronize memory access operations of the memory die based at least in part on the adjusted data clock signal.

13. An apparatus comprising:
a memory die configured to receive a system clock signal, a data clock signal, and an indication of a delay,
wherein the memory die comprises a delay adjuster configured to delay the data clock signal based at least in part on the indication of the delay to generate an adjusted data clock signal,
wherein the delay adjuster comprises:
a switch configured to receive at least a portion of the data clock signal and the indication of the delay;
first circuitry coupled with the switch and configured to delay the at least the portion of the data clock signal by a first delay amount; and
second circuitry coupled with the switch and configured to delay the at least the portion of the data clock signal by a second delay amount different than the first delay amount,
wherein the switch is configured to provide the data clock signal to the first circuitry or the second circuitry based at least in part on the indication of the delay to cause the first circuitry or the second circuitry to generate the adjusted data clock signal, and
wherein the memory die is configured to synchronize memory access operations of the memory die based at least in part on the adjusted data clock signal; and
wherein the memory die further comprises a phase detector coupled with the first circuitry and the second circuitry, the phase detector configured to:
receive the system clock signal and the data clock signal;
determine an offset between the system clock signal and the data clock signal; and
output an indication of the offset.

14. An apparatus comprising:
a memory die configured to receive a system clock signal, a data clock signal, and an indication of a delay,
wherein the memory die comprises a delay adjuster configured to delay the data clock signal based at least in part on the indication of the delay to generate an adjusted data clock signal,
wherein the delay adjuster comprises:
a switch configured to receive at least a portion of the data clock signal and the indication of the delay;
first circuitry coupled with the switch and configured to delay the at least the portion of the data clock signal by a first delay amount; and
second circuitry coupled with the switch and configured to delay the at least the portion of the data clock signal by a second delay amount different than the first delay amount,
wherein the switch is configured to provide the data clock signal to the first circuitry or the second circuitry based at least in part on the indication of the delay to cause the first circuitry or the second circuitry to generate the adjusted data clock signal, and wherein the memory die is configured to synchronize memory access operations of the memory die based at least in part on the adjusted data clock signal; and wherein the memory die further comprises a phase detector coupled with the first circuitry and the second circuitry, the phase detector configured to:
receive the system clock signal and the adjusted data clock signal;
determine an offset between the system clock signal and the adjusted data clock signal; and
output an indication of the offset.

15. An apparatus comprising:
a memory die configured to receive a system clock signal, a data clock signal, and an indication of a delay,
wherein the memory die comprises a delay adjuster configured to delay the data clock signal based at least in part on the indication of the delay to generate an adjusted data clock signal,
wherein the delay adjuster comprises:
a switch configured to receive at least a portion of the data clock signal and the indication of the delay;
first circuitry coupled with the switch and configured to delay the at least the portion of the data clock signal by a first delay amount; and
second circuitry coupled with the switch and configured to delay the at least the portion of the data clock signal by a second delay amount different than the first delay amount,
wherein the switch is configured to provide the data clock signal to the first circuitry or the second circuitry based at least in part on the indication of the delay to cause the first circuitry or the second circuitry to generate the adjusted data clock signal, and
wherein the memory die is configured to synchronize memory access operations of the memory die based at least in part on the adjusted data clock signal; and
wherein the memory die further comprises a phase splitter coupled with the switch, the phase splitter configured to:
receive the data clock signal;
split the data clock signal into a plurality of phases; and
provide at least a first phase of the plurality of phases to the switch, wherein the at least the portion of the data clock signal comprises the at least the first phase.

16. The apparatus of claim 15, further comprising:
a first port for receiving the data clock signal, wherein the first port is coupled with the phase splitter; and
a second port for receiving the system clock signal.

17. The apparatus of claim 16, further comprising:
a second memory die coupled with the first port and the second port and configured to receive the data clock signal and the system clock signal.

18. A method, comprising:
receiving, at a memory package comprising a plurality of memory dice, a data clock signal and a system clock signal;
routing the data clock signal and the system clock signal to at least a first memory die of the plurality of memory dice;
determining, at the first memory die of the plurality of memory dice, a first offset between the data clock signal as received at the first memory die and the system clock signal as received at the first memory die; and
adjusting, at the first memory die based at least in part on the first offset, the data clock signal as received at the first memory die by a first delay amount to generate an adjusted data clock signal for the first memory die.

19. The method of claim 18, wherein routing the data clock signal and the system clock signal to the at least the first memory die of the plurality of memory dice comprises routing the data clock signal and the system clock signal to a second memory die of the plurality of memory dice, the method further comprising:
determining, at the second memory die, a second offset between the data clock signal as received at the second memory die and the system clock signal as received at the second memory die; and
adjusting, at the second memory die based at least in part on the second offset, the data clock signal as received at the second memory die by a second delay amount to generate a second adjusted data clock signal for the second memory die.

20. The method of claim 19, further comprising:
transmitting, to a controller, an indication of the first offset, the second offset, or both.

* * * * *